(12) United States Patent
Kan'an et al.

(10) Patent No.: US 10,083,747 B2
(45) Date of Patent: Sep. 25, 2018

(54) TUBE-SHAPED RECONFIGURABLE PHASE CHANGE DEVICE HAVING MULTIPLE SETS OF CONTACTS

(71) Applicant: University of Connecticut, Farmington, CT (US)

(72) Inventors: Nadim H. Kan'an, Mansfield Center, CT (US); Ali Gokirmak, Mansfield Center, CT (US); Helena Silva, Mansfield Center, CT (US)

(73) Assignee: UNIVERSITY OF CONNECTICUT, Farmington, CT (US)

( * ) Notice: Subject to any disclaimer, the term of this patent is extended or adjusted under 35 U.S.C. 154(b) by 0 days.

(21) Appl. No.: 15/306,039

(22) PCT Filed: Apr. 23, 2015

(86) PCT No.: PCT/US2015/027349
§ 371 (c)(1),
(2) Date: Oct. 21, 2016

(87) PCT Pub. No.: WO2015/164640
PCT Pub. Date: Oct. 29, 2015

(65) Prior Publication Data
US 2017/0249988 A1 Aug. 31, 2017

Related U.S. Application Data

(60) Provisional application No. 61/983,129, filed on Apr. 23, 2014, provisional application No. 61/983,132, filed on Apr. 23, 2014.

(51) Int. Cl.
*H01L 47/00* (2006.01)
*G11C 13/00* (2006.01)
(Continued)

(52) U.S. Cl.
CPC ...... *G11C 13/0069* (2013.01); *G11C 13/0004* (2013.01); *G11C 13/0097* (2013.01);
(Continued)

(58) Field of Classification Search
CPC ............ G11C 13/0069; G11C 13/0004; G11C 11/5678; G11C 14/0045; G11C 14/009; H01L 45/06; H01L 27/2463
See application file for complete search history.

(56) References Cited

U.S. PATENT DOCUMENTS

2010/0321992 A1   12/2010   Liu et al.
2011/0102016 A1    5/2011   Chen et al.
(Continued)

OTHER PUBLICATIONS

International Search Report and Written Opinion, PCT Application No. PCT/US2015/027349, dated Sep. 16, 2015.

*Primary Examiner* — Matthew Gordon
(74) *Attorney, Agent, or Firm* — Kilpatrick Townsend & Stockton LLP

(57) ABSTRACT

A reconfigurable phase change device with methods for operating and forming the same are disclosed. An example device can comprise a reconfigurable layer comprising a phase change material, and a set of contacts connected with the reconfigurable layer. The set of contacts can comprise at least a first contact, a second contact, and a third contact. The device can comprise at least one control element electrically coupled with one or more of the set of contacts. The at least one control element can be configured to supply a first control signal to one or more of the set of contacts. The first control signal can be configured to modify a first portion of the reconfigurable layer thereby isolating the first contact from the second contact and the third contact.

17 Claims, 44 Drawing Sheets

(51) Int. Cl.
*H01L 45/00* (2006.01)
*H01L 27/24* (2006.01)

(52) U.S. Cl.
CPC .......... *H01L 27/2463* (2013.01); *H01L 45/06* (2013.01); *H01L 45/1206* (2013.01); *H01L 45/1233* (2013.01); *H01L 45/1253* (2013.01); *H01L 45/144* (2013.01); *H01L 45/1608* (2013.01); *G11C 2013/009* (2013.01); *G11C 2213/52* (2013.01); *G11C 2213/53* (2013.01)

(56) References Cited

U.S. PATENT DOCUMENTS

| | | | |
|---|---|---|---|
| 2011/0235436 A1* | 9/2011 | Fukuzumi | G11C 13/0007 365/185.26 |
| 2012/0094458 A1* | 4/2012 | Cai | H01L 27/0705 438/286 |
| 2012/0182794 A1 | 7/2012 | Kordus, II et al. | |
| 2014/0063932 A1* | 3/2014 | Krebs | H01L 27/2481 365/163 |

* cited by examiner

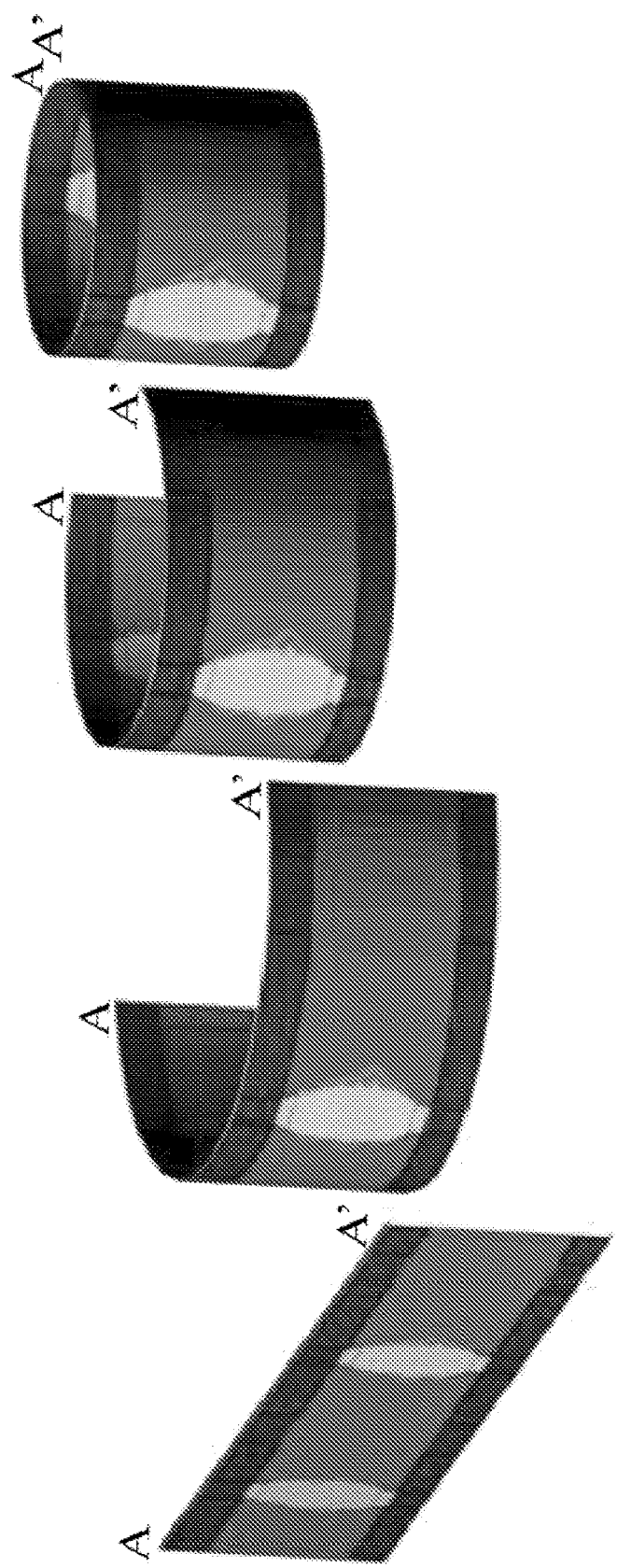

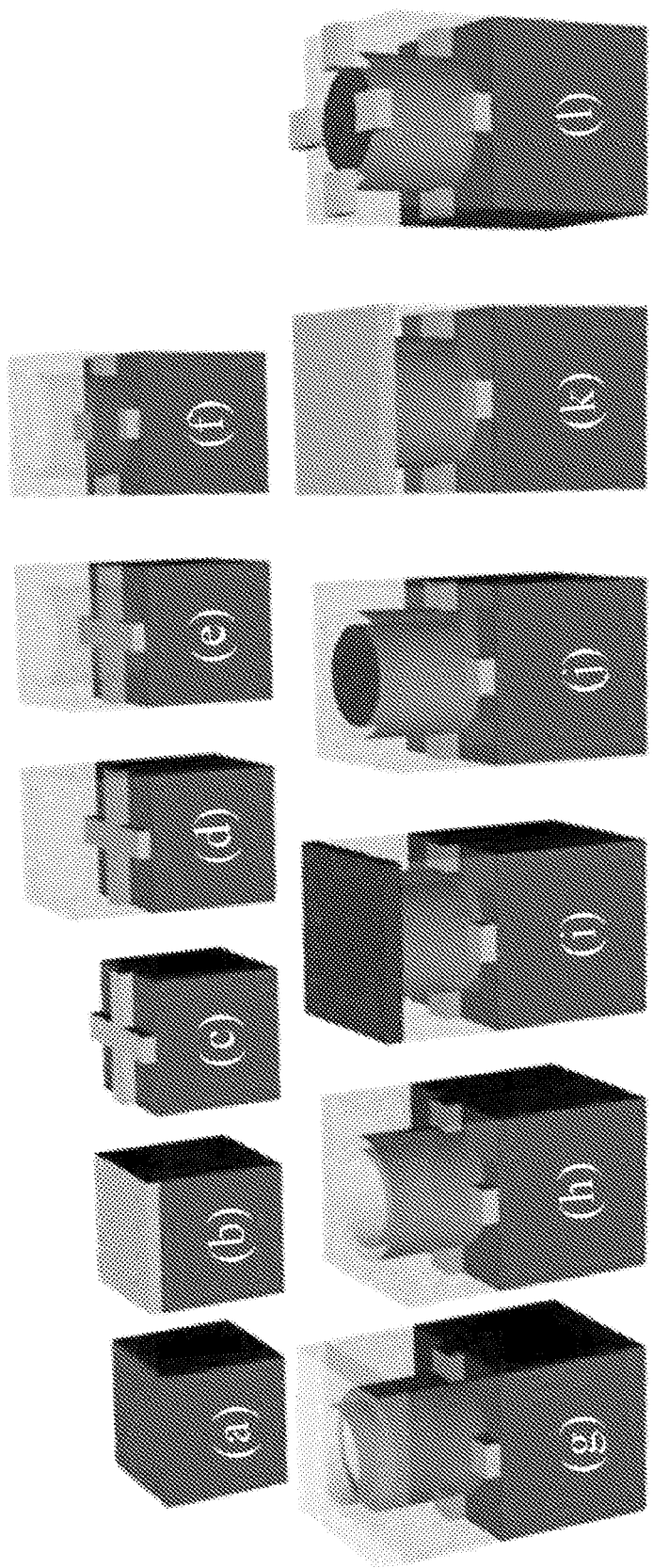

FIG. 7

| Configuration | Descriptor | Write combination (M1M2)(V1V2) | Implemented function of I1I2 |
|---|---|---|---|
| 1 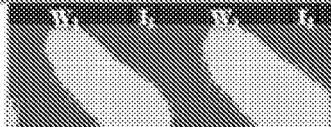 | $O_1 = I_1$<br>$O_2 = I_2$ | Two write words<br>(0101),<br>(1010) | I1I2  O1  O2<br>00    0   0<br>01    1   0<br>10    0   1<br>11    1   1 |
| 2  | $O_1 = I_2$<br>$O_2 = I_1$ | Two write words<br>(0110),<br>(1001) | I1I2  O1  O2<br>00    0   0<br>01    0   1<br>10    1   0<br>11    1   1 |
| 3 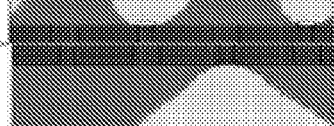 | Output $O_2$ isolated | Two write words<br>(0110),<br>(0101) | I1I2  O1  O2<br>00    0   0<br>01    1   0<br>10    1   0<br>11    1   0 |
| 4 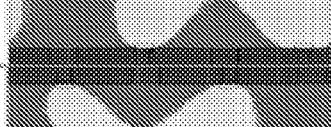 | input $I_1$ isolated | Two write words<br>(1010),<br>(0110) | I1I2  O1  O2<br>00    0   0<br>01    1   1<br>10    0   0<br>11    1   1 |
| 5 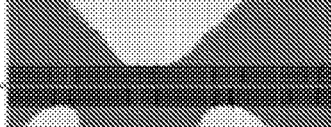 | input $I_2$ isolated | Two write words<br>(1001),<br>(0101) | I1I2  O1  O2<br>00    0   0<br>01    0   0<br>10    1   1<br>11    1   1 |
| 6 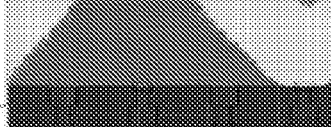 | Output $O_1$ isolated | Two write words<br>(1010),<br>(1001) | I1I2  O1  O2<br>00    0   0<br>01    0   1<br>10    0   1<br>11    0   1 |
| 7  | Output $O_2$ and input $I_2$ are isolated. | Three write words<br>(1010),<br>(0110), (0101) | I1I2  O1  O2<br>00    0   0<br>01    1   0<br>10    0   0<br>11    1   0 |
| 8  | Output $O_1$ and input $I_2$ are isolated. | Three write words<br>(1001),<br>(1010), (0110) | I1I2  O1  O2<br>00    0   0<br>01    0   0<br>10    0   1<br>11    0   1 |
| 9  | Device is totally isolated. | Four write words<br>(1001),<br>(1010),<br>(0110), (0101) | I1I2  O1  O2<br>00    0   0<br>01    0   0<br>10    0   0<br>11    0   0 |

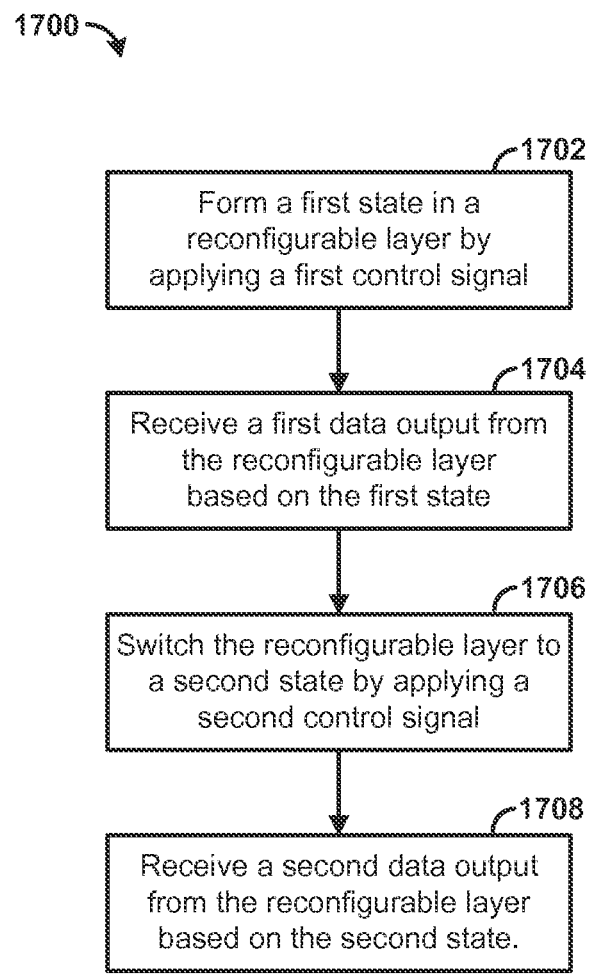

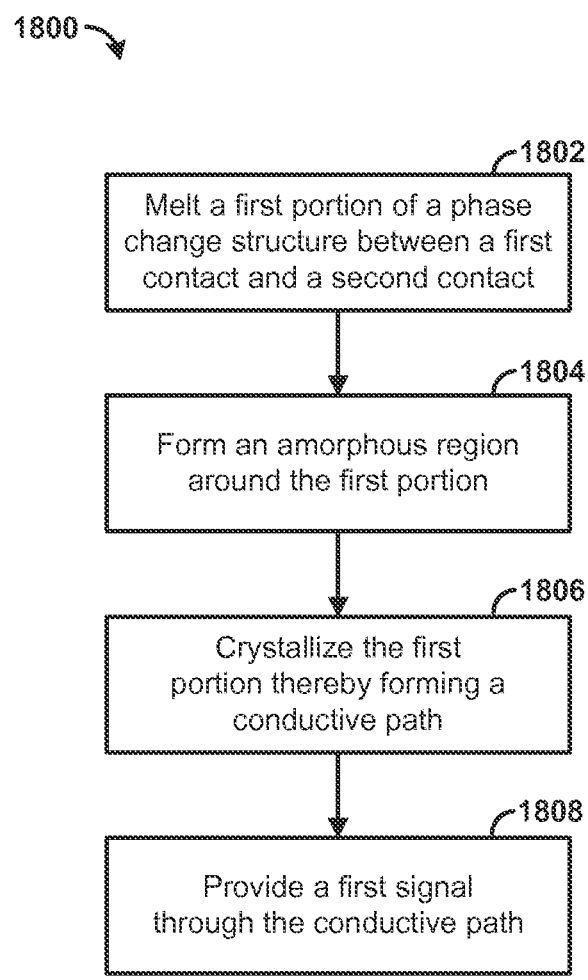

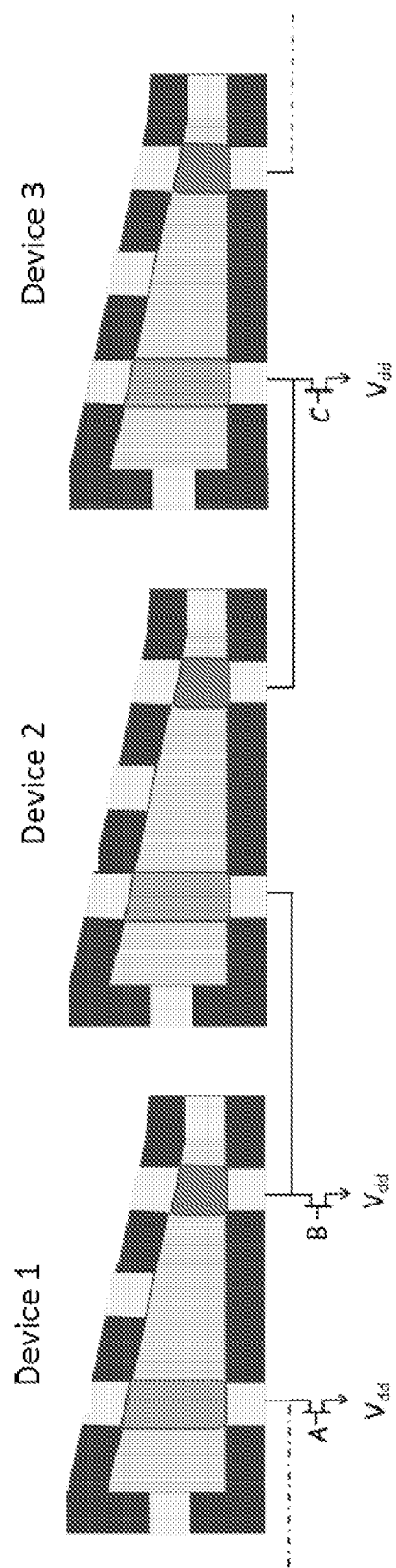

The DC voltage source and the transistor's resistance can be transformed into a current source and a parallel resistor

TUBE-SHAPED RECONFIGURABLE PHASE CHANGE DEVICE HAVING MULTIPLE SETS OF CONTACTS

CROSS REFERENCE TO RELATED PATENT APPLICATION

This application claims priority to U.S. Provisional Application No. 61/983,132 filed Apr. 23, 2014, and U.S. Provisional Application No. 61/983,129 filed Apr. 23, 2014, herein incorporated by reference in their entirety.

STATEMENT REGARDING FEDERALLY FUNDED RESEARCH

This invention was made with government support under grant 0925973 and grant 1150960 awarded by the National Science Foundation. The government has certain rights in the invention.

BACKGROUND

Reconfigurable logic devices, such as reconfigurable arrays, are mainly transistor based, wherein multiple transistors are utilized to switch between the inputs and outputs. Reconfigurable arrays can also be made by utilizing antifuses or other types of nonvolatile memory (NVM) elements. However, scalability, configuration time, access speed, and complexity of fabrication process for current reconfigurable logic devices needs to be improved to reach their full potential in devices of commercial value. These and other shortcomings are addressed by the disclosed devices and processes.

SUMMARY

It is to be understood that both the following general description and the following detailed description are exemplary and explanatory only and are not restrictive, as claimed. The present disclosure relates to a reconfigurable device, methods of operating the device, and a fabrication process thereof. An example device (e.g., apparatus) can comprise a reconfigurable layer comprising a phase change material and a set of contacts connected with the reconfigurable layer. The set of contacts can comprise at least a first contact, a second contact, and a third contact. The example device can comprise at least one control element electrically coupled with one or more of the set of contacts. The at least one control element can be configured to supply a first control signal to one or more of the set of contacts. The first control signal can be configured to modify a first portion of the reconfigurable layer thereby isolating the first contact from the second contact and the third contact.

In another aspect, an example method can comprise forming a first state in a reconfigurable layer at least in part by applying a first control signal to one or more of a set of contacts electrically connected with the reconfigurable layer. The set of contacts can comprise at least a first contact, a second contact, and a third contact. The first control signal can modify a first portion of the reconfigurable layer thereby isolating the first contact from the second contact and the third contact. A first data output can be received from the reconfigurable layer based on the first state of the reconfigurable layer. The reconfigurable layer can be switched to a second state at least in part by applying a second control signal to one or more of the set of contacts electrically connected with the reconfigurable layer. The second control signal can change which of the set of contacts are isolated or not isolated. A second data output can be received from the reconfigurable layer based on the second state.

In another aspect, an example method can comprise melting a first portion of a phase change structure between a first contact connected with the phase change structure and a second contact connected with the phase change structure. An amorphous region can be formed around the first portion. The first portion can be crystallized thereby forming a conductive path from the first contact to the second contact. The conductive path can be isolated, at least in part by the amorphous region, from a third contact connected with the phase change structure. A first signal can be provided through the conductive path.

In another aspect, an example method can comprise forming a first set of electrodes on a substrate. A first insulating layer can be deposited upon the substrate and first set of electrodes. A well can be formed in the first insulation layer. A reconfigurable layer can be formed at least in part by depositing a phase change material upon sidewalls the well. The first set of electrodes can be electrically connected with a bottom of the reconfigurable layer. A second set of electrodes electrically connected with a top of the reconfigurable layer can be formed.

In another aspect, an example apparatus can comprise a medium and a set of contacts connected with the medium. The set of contacts can be configured to cause at least a first path in the medium and a second path in the medium. The apparatus can comprise a control element electrically coupled with the set of contacts and configured to selectively couple a source to the set of contacts. A first coupling of the source to the set of contacts can cause the first path to become more conductive than the second path. A second coupling of the source to the set of contacts can cause the first path to become more conductive than the second path.

In another aspect, an example method can comprise coupling a source to a set of contacts configured to channel the source across a medium though a first path and a second path. Coupling the source can cause the first path to become more conductive than the second path. The source can be uncoupled from the set of contacts. Uncoupling the set of contacts can cause the first path to become less conductive than the second path. The source can be recoupled to with the set of contacts. Recoupling the set of contacts can cause the first path to become more conductive than the second path.

In another aspect, an example method can comprise providing a first command signal to a device to cause a first state in the device. The device can comprise a set of contacts configured to channel command signals through one or more of a first path and a second path. The portion of the first command signal can be channeled through the first path thereby cause the second path to become more conductive. A first output signal can be received from the device based on the first state. A second command signal can be provided to the device to cause a second state in the device after receiving the first output signal. At least a portion of the second command signal can be channeled through the second path thereby causing the first path to become more conductive. A second output signal can be received based on the second state.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3 is a three-dimensional schematic view of a wrapped phase change device;

FIG. 5 illustrates an exemplary process for forming a reconfigurable device;

FIG. 7 is a table illustrating some configurations of a reconfigurable device along with the corresponding write commands and truth tables;

FIG. 17 is a flow chart illustrating an example method for operating a reconfigurable device;

FIG. 18 is a flow chart illustrating another example method for operating a reconfigurable device;

FIG. 26A illustrates an initial state (all crystalline) of the reconfigurable device;

DETAILED DESCRIPTION

Figure 1A:
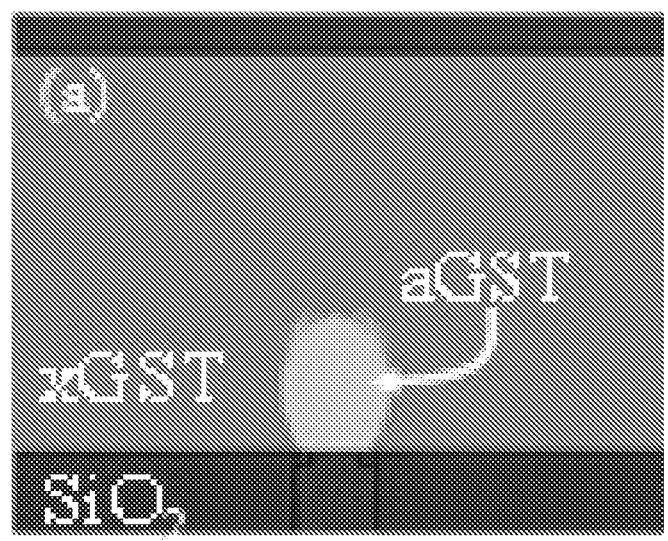
FIG. 1A illustrates the conductivity profile for a reset operation showing an amorphized volume as a result of utilizing a slow rise pulse.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" can mean that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" can mean "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems can be understood more readily by reference to the following detailed description of preferred embodiments and the examples included therein and to the Figures and their previous and following description.

As will be appreciated by one skilled in the art, the methods and systems can take the form of an entirely hardware embodiment, an entirely software embodiment, or an embodiment combining software and hardware aspects. Furthermore, the methods and systems can take the form of a computer program product on a computer-readable storage medium having computer-readable program instructions (e.g., computer software) embodied in the storage medium. More particularly, the present methods and systems can take the form of web-implemented computer software. Any suitable computer-readable storage medium can be utilized including hard disks, CD-ROMs, optical storage devices, flash memory internal or removable, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions can be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions can also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions can also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and the combinations of blocks in the block diagrams and flowchart illustrations, can be implemented by special purpose hardware-based computer systems that perform the specified functions or steps, or combinations of special purpose hardware and computer instructions.

The present disclosure relates to reconfigurable devices, such as a phase change devices, along with associated methods for operating and forming the same. In an aspect, non-conducting (e.g., amorphized) paths can be formed electrically in a reconfigurable device by high-voltage, short-duration pulses (e.g., a reset operation) in a crystalline or amorphous medium, and the non-conducting (e.g., amorphized) paths can be used to isolate a first set of contacts (e.g., input contacts) and a second set of contacts (e.g., output contacts), thus implementing a desired functionality. In an aspect, conducting paths can be made between a first set and a second set of contacts by applying long-duration (e.g., in the order of 10 s of nanoseconds) low-voltage (e.g., in the order of 0.1 V) pulses between the first set and second set of contacts, when the phase change material (PCM) is amorphous. In an aspect, the crystalline-to-amorphous phase transition can be utilized to form highly resistive paths that isolate different device contacts (e.g., terminals, electrodes), forcing the current to flow through insulated crystalline paths. In an aspect, different amorphized paths can result in a different device configuration in terms of addressing certain inputs to certain outputs. Thus, the reconfigurable device can be used in reconfigurable logic applications as well as signal routing applications.

In an aspect, a disclosed method for fabricating the disclosed reconfigurable device can comprise forming a first set of contacts on a substrate, depositing a first insulation layer on the substrate and the first set of contacts, forming a well in the first insulation layer and the first set of contacts, depositing a layer of phase change material (PCM) on the first insulation layer. The layer of PCM can comprise a hole that aligns with the well. The method can further comprise depositing a second insulation layer on the layer of phase change material, and forming a second set of contacts on the second insulation layer. The reconfigurable device can also be achieved using different phase change materials, such as GST, GeTe, SbTe, and combinations thereof. The reconfigurable device can be embodied in various configurations with differing number of contacts, arrangements, and dimensions.

In an aspect, the disclosed reconfigurable device can be a single device configured to route signals without the need of external wiring. In an aspect, the reconfiguration time for the reconfigurable device can be fast (e.g., in the order of 100 ns). In an aspect, the disclosed device can be a strong candidate for the in-processor logic operations and can be used to replace the conventional switching mechanisms and signal routing in the low-power reconfigurable electronics applications. For example, the reconfigurable device can be used for a phase-change memory. In an aspect, the fabrication process for the disclosed device can be simple. The fabrication process of the reconfigurable device can enhance the scalability of the device, as the dimensions of the reconfigurable device can be in the order of nanometers.

Figure 1B:
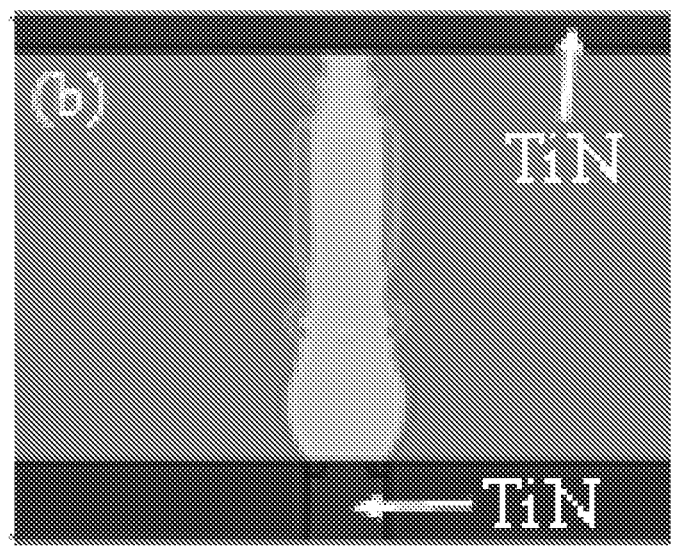
FIG. 1B illustrates the conductivity profile for the reset operation showing the amorphized volume as a result of utilizing fast rise pulse resulting in filament formation across the top and bottom contacts.

FIG. 1A and FIG. 1B illustrate various aspects of an exemplary environment in which the present methods and systems can operate. Specifically, FIG. 1A and FIG. 1B show a conductivity profile for a reset operation. FIG. 1A shows the amorphized volume as a result of utilizing a slow rise time pulse FIG. 1B shows the amorphized volume as a result of utilizing a fast rise time pulse. Utilizing a fast rise time pulse can result in filament formation across the top and bottom contacts. In an aspect, $Ge_2Sb_2Te_5$ (GST) chalcogenide alloy can be used as a phase change material. The resistivity of GST can be a function of temperature. Specifically, the amorphous and crystalline-FCC resistivities can decay exponentially with a temperature increase resulting in thermal runaway. In PCM mushroom cells, for example, utilizing reset pulses with a fast rise time pulse and providing sufficient current can lead to formation of elongated filaments across the device terminals due to thermal runaway as shown in FIG. 1B.

Figure 2A:
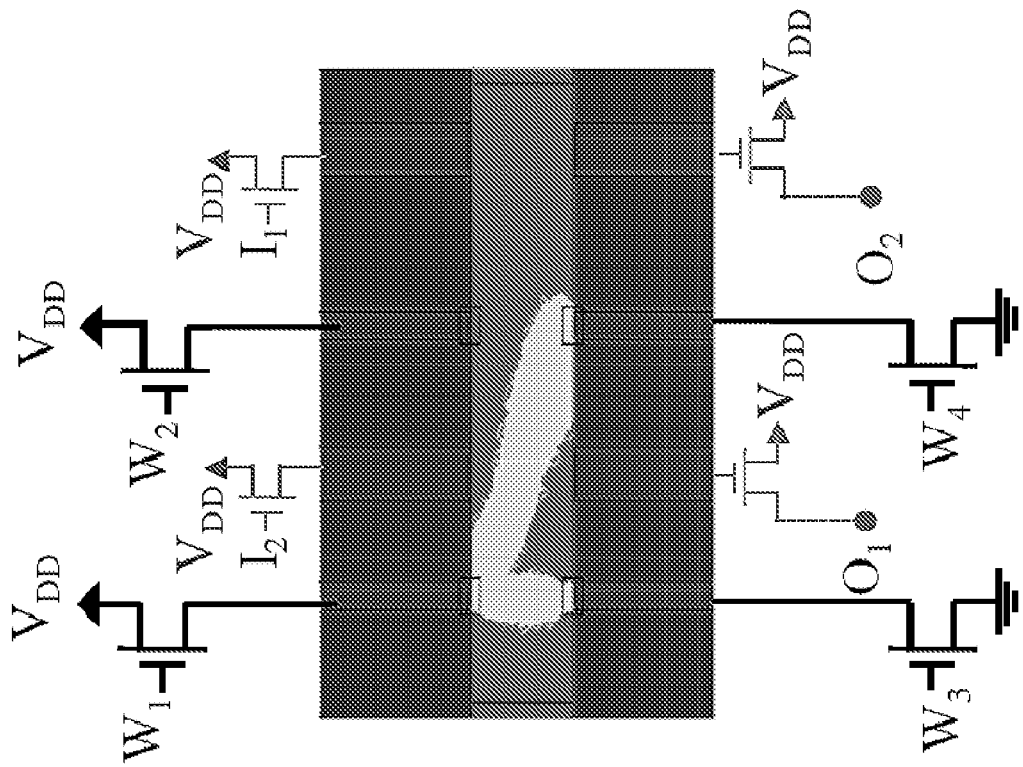
FIG. 2A illustrates a simulated 8-contact reconfigurable device with 2-inputs, 2-outputs, and 4-write terminals in a first state.
Figure 2B:
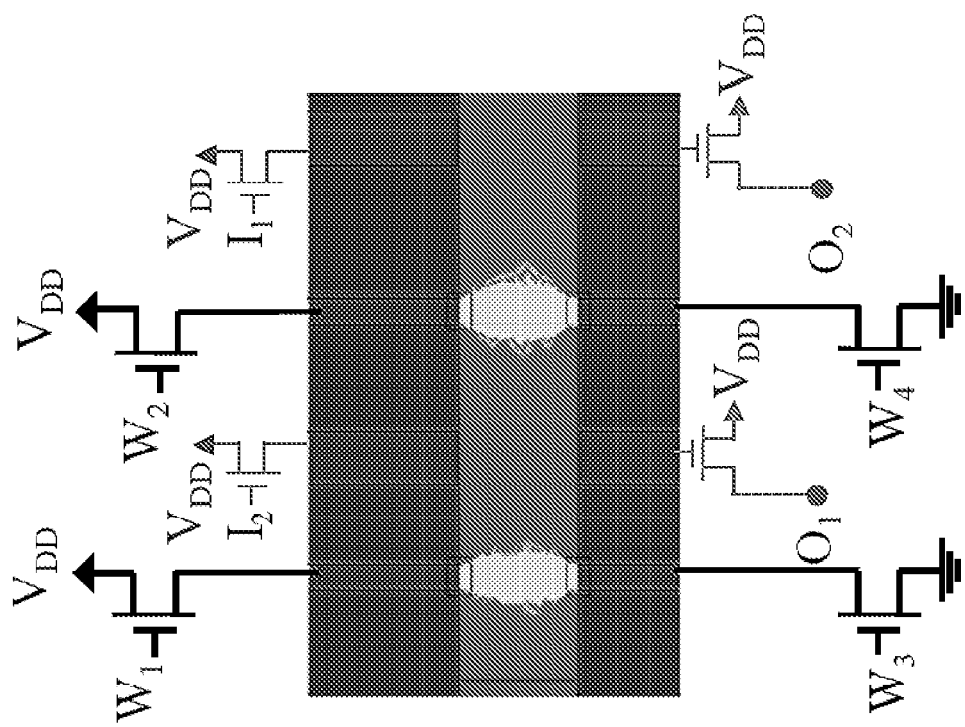
FIG. 2B illustrates the simulated 8-contact reconfigurable device with 2-inputs, 2-outputs, and 4-write terminals in a second state.

FIG. 2A and FIG. 2B illustrates an example reconfigurable device. The device can comprise a phase change device. The reconfigurable device can comprise an 8-contact phase-change device. For example, the reconfigurable device can comprise 2-inputs (e.g., $I_1$, $I_2$). The device can comprise 2-outputs (e.g., $O_1$, $O_2$). The reconfigurable device can comprise 4-write terminals (e.g., $W_1$, $W_2$, $W_3$, $W_4$). The reconfigurable device can be integrated with digital (binary) CMOS which can have rail to rail operation, namely, inputs and outputs are either high (1) or low (0) access FETs for inputs. The outputs can be scalable depending on the fan-out configuration and is not limited by write current requirements. In an aspect, filament formation can be utilized to melt, amorphize, and/or the like different paths in a multi-contact geometry. For example, the simulated device shown in FIG. 2A and FIG. 2B can be implemented on a rectangular thin film GST patch making contact with two input (e.g., $I_1$, $I_2$) and two control (e.g., $W_1$, $W_2$) terminals on one side, two output (e.g., $O_1$, $O_2$), and two control terminals (e.g., $W_3$, $W_4$) on another side as shown in FIG. 2A and FIG. 2B. In an aspect, the implementation can be performed by control terminals, and can be read by the input and output terminals. Passing enough current with fast rise time pulses through control terminals can form an amorphized path, resulting in a configuration that can alter the connection between the inputs terminals and outputs terminals. For example, activating transistors $W_1$, $W_3$ at the same time (i.e., sending the write command (e.g., $W_1=1$, $W_2=0$, $W_3=1$, $W_4=1$, wherein 1 represents a 2 V pulse) can amorphize the path between them. Consequently, a path between transistors $W_2$ and $W_4$ can be amorphized by sending the write word (e.g., $W_1=0$, $W_2=1$ $W_3=0$ $W_4=1$). The write word can result in a specific configuration where $I_2$ can be connected to $O_1$ and $I_1$ can be connected to $O_2$ by crystalline paths that can insulated from each other by the highly resistive amorphized paths. Other configurations of the GST patch can be achieved by sending different writing commands as shown in FIG. 2B.

The functionality of the disclosed phase change device can depend on how phase change material elements are integrated with CMOS. In an aspect, if I/O terminals can be used for the write operation, rise times, voltages (or currents), and coordination of the I/O waveforms can be controlled and read using smaller voltages. Alternatively, the disclosed reconfigurable devices can be configured to have dedicated write and read terminals, as shown in FIG. 2A and FIG. 2B, making an eight terminal structure for 2-bit operation. This approach can reduce complexity associated with the write and read operations and can be easier to integrate with digital (binary) CMOS which has rail to rail operation (inputs and outputs are either high (1) or low (0)). In a 2D patch, all I/O connectivity combinations other than swap function (Output 1=Input 2, Output 2=Input 1) can be achieved.

FIG. 3 is a 3D schematic view of a illustrating an example reconfigurable layer 300. The reconfigurable layer 300 can be implemented as a flat (e.g., substantial two-dimensional) planar layer. In some scenarios, the reconfigurable layer 300 can be formed as three-dimensional shape, such as a tube or pipe shape. Such configuration can be visualized as planar layer that is wrapped to form a tube shape. This can be illustrated, for example, as connecting two sides (i.e., left and right edges) of a planar reconfigurable layer as shown in FIG. 3. Such three-dimensional shape can allow a reconfigurable device to implement a swap function. For example, the swap function can be implemented because input terminals coupled to the reconfigurable layer can be connected to either one of the output terminals coupled to the reconfigurable layer.

Figure 4:
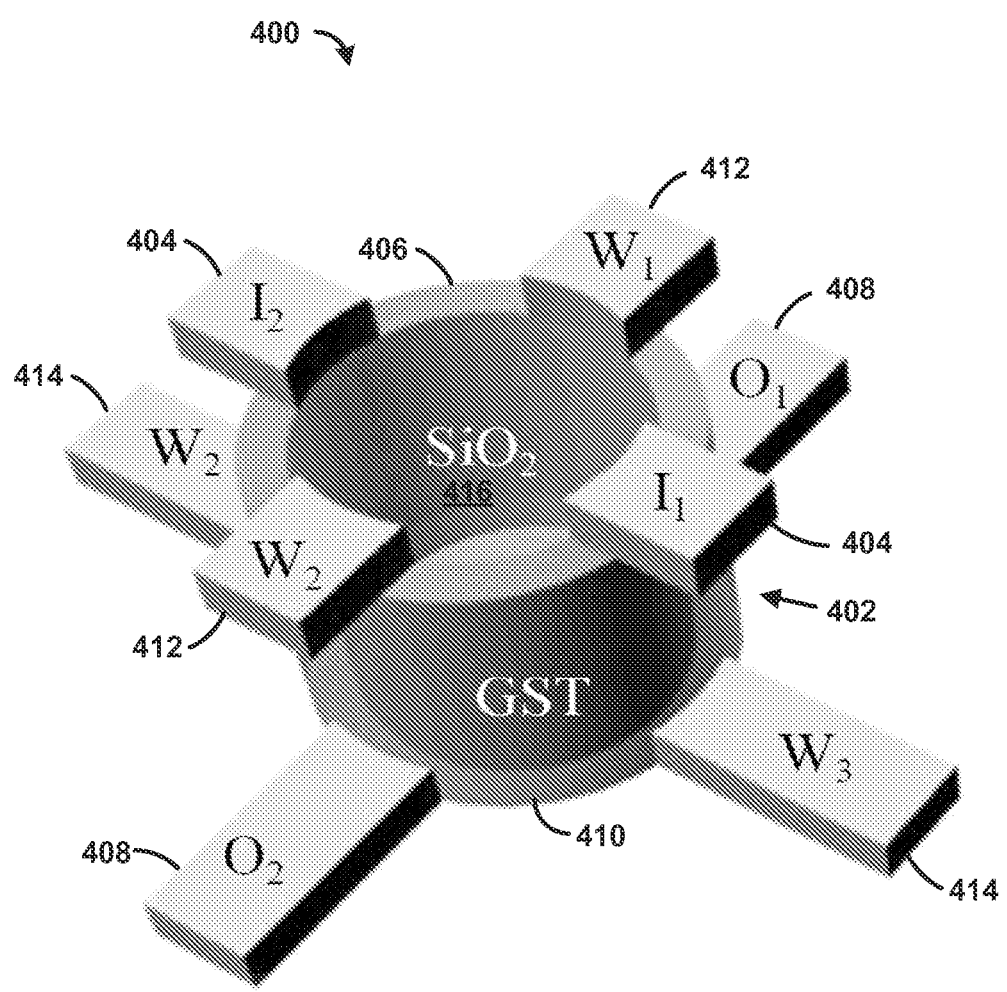
FIG. 4 is a three-dimensional schematic view of a phase change pipe.

FIG. 4 is a schematic view of an example reconfigurable device 400. In an aspect, the reconfigurable device can comprise a reconfigurable layer 402. The reconfigurable layer 402 can comprise a phase change material, such as GST. The reconfigurable layer 402 can be formed as tube, a pipe, and/or or other shape. For example, the height and the diameter of the reconfigurable layer 402 can be significantly larger (e.g., three times and more) than the wall thickness of the reconfigurable layer 402, as shown in FIG. 4. The reconfigurable device 400 can comprise input contacts 404. The input contacts 404 can be connected to a first side 406 of the reconfigurable layer, such as a top or bottom of the reconfigurable layer 402. The reconfigurable device 400 can comprise output contacts 408. The output contacts 408 can be connected to a second side 410 of the reconfigurable layer 402, such as a top or a bottom of the reconfigurable layer 402. The first side 406 can be opposite from the second side 410. The reconfigurable device 400 can also comprise one or more control contacts 412 and 414. For example the control contacts can comprise a first set 412 of control contacts. The first set 412 of control contacts can be located on the first side 406. The one or more control contacts can comprise a second set 414 of control contacts. The second set 414 of control contacts can be located on the second side 410. In an aspect, the reconfigurable layer 402 can be disposed around an insulating layer 416 comprising, silicon dioxide or other suitable material.

FIG. 5 illustrated an exemplary fabrication procedure. In an aspect, an example reconfigurable device can be fabricated using a side-wall process. Step (a) illustrates forming a thermal oxide layer on a Si substrate. Step (b) illustrates depositing of a first metal layer. Step (c) shows etching the metal layer to form a first set of electrodes (e.g., a cross with 4 contacts). Step (d) illustrates depositing a $SiO_2$ layer. Step (e) shows forming a well using a lithography technique and an etching technique of the $SiO_2$ layer. Step (f) shows etching the first metal layer. Step (g) illustrates depositing GST, using reactive ion etching (RIE). Step (h) illustrates forming a GST side-wall. Step (i) illustrates depositing a second insulating layer ($SiO_2$ or $Si_3N_4$). Step (j) illustrates planarization. Step (k) illustrates depositing a second metal layer. Step (j) illustrates forming a second set of electrodes. It should be noted that the same structure can also be achieved using a cubic geometry. For example, a cube can be formed. Then, a well (e.g., cylindrical, cubic shaped) can be formed in the cube. For example, any hollow structure having a closed surface (e.g., along at least one access) with open ends can be utilized.

As an example, a fabrication process for the reconfigurable device can comprise forming a first set of contacts on a substrate, depositing a first insulation layer on the substrate and the first set of contacts, forming a well in the first insulation layer and the first set of contacts, depositing a layer of phase change material (PCM) on the first insulation layer, wherein the layer of PCM can comprise a hole that aligns with the well, depositing a second insulation layer on the layer of phase change material, and forming a second set of contacts on the second insulation layer.

Figure 6B:
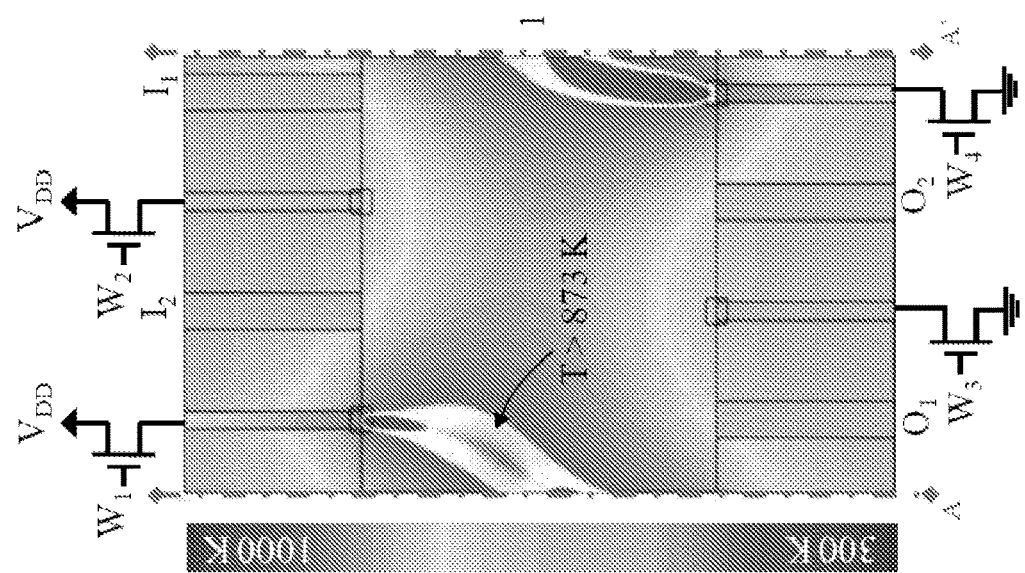
FIG. 6B shows a peak thermal profile for applying write pulses to the reconfigurable device.
Figure 6A:
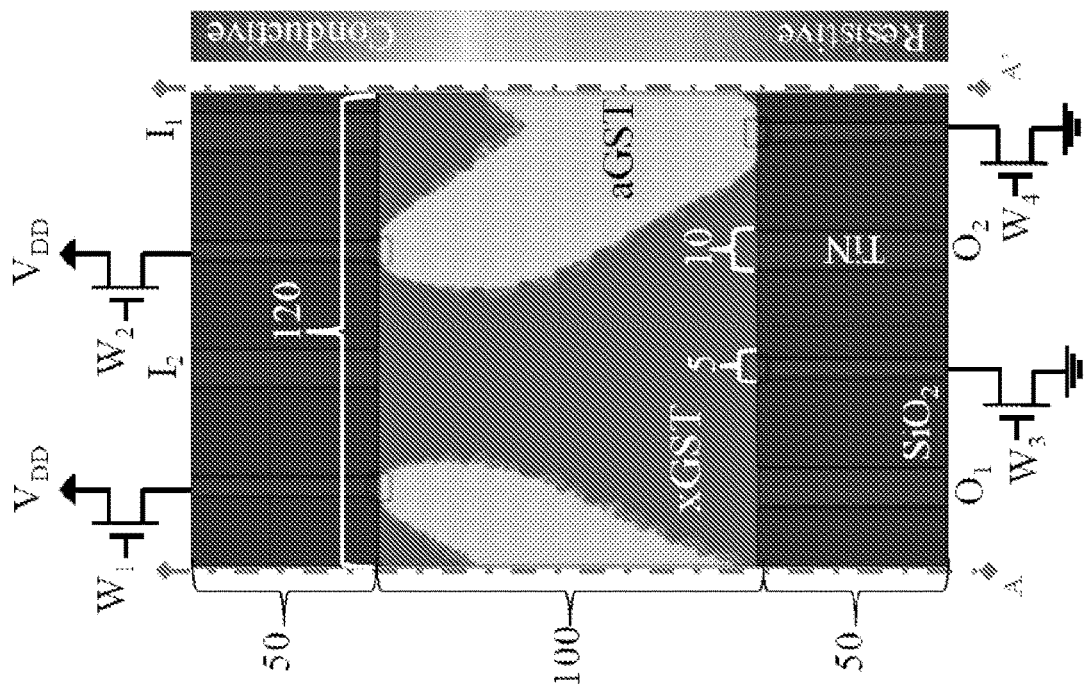
FIG. 6A shows a model of a conductivity profile of the reconfigurable device after sending two write words.

A film made of phase change material (e.g., GST) can be deposited on a variety of materials such as $SiO_2$, $Si_3N_4$, and topographies and annealed for densification using infrared, microwave and furnace annealing. The film can be characterized in physical term and electrical term. In an aspect, the disclosed phase change device can be fabricated using the film with desired characteristics. In an aspect, computational tools can be used to evaluate necessary conditions for the device operations, functional implementation and the necessary access devices. The disclosed device can be integrated with circuits and architectures for computation using computational tools. FIG. 6A and FIG. 6B illustrate an exemplary modeled reconfigurable device with dimensions in nm. Specifically, the reconfigurable device can be modeled by a $L \times W \times D = 120 \times 100 \times 20$ nm GST layer with eight TiN contacts. Periodic boundary conditions can be applied at the left and the right sides of the layer so that both the left side and the right side act as if they are connected to each other to imitate a tube structure. In an aspect, the reconfigurable device 600 can be a sandwiched structure between two layers of $SiO_2$ of 100 nm of thickness. FIG. 6B shows a peak thermal profile for applying a 2 V write pulse that activates transistors $W_1$ and $W_4$ (e.g., with write commands $W_1=1$, $W_2=0$, $W_3=0$, $W_4=0$). White contour lines denote the boundaries of melting in an active region. FIG. 6A shows a model of a conductivity profile of the reconfigurable device 600 after sending two write words (e.g., 1001; 0101). The amorphized regions of the reconfigurable layer are shown in a lighter shade while crystallized regions are shown in a darker shade.

In an aspect, FIG. 6A and FIG. 6B illustrate an example reconfigurable device 600 in which terminal spacing is staggered. If the top write contacts ($W_1$, $W_2$) are aligned with the bottom write contacts $W_3$, $W_4$, the terminal spacing can be non-uniform to achieve deterministic write operations. For example, if the spacing between the set of contacts is equal, the current will have two equally probable paths to flow in. This configuration can lead to nondeterministic operation of the device. One way of causing the operation to be deterministic is by having different spacing between the contacts (non-uniform spacing). In such case, the current will always have a more preferable path to follow. Otherwise, clock-wise and counter-clock wise current paths may be equally likely. An alternative approach, shown in in FIG. 6A and FIG. 6B, can be to stagger top write terminals and bottom write terminals (e.g., $W_1$ aligned with $O_1$, $I_1$ aligned with $W_3$, etc.). This staggered configuration can force current flow in diagonal paths. The amorphized filaments formed by the current can form diagonals and can be deterministic, which can alleviate complexity associated with a set operation (e.g., center part of amorphized filaments do not need to be recrystallized).

In an aspect, the reconfigurable device 600 can be implemented in high-performance logic for non-volatile routing, multiplexing, functional implementation and data storage for significantly lower power operation as the endurance problems are alleviated.

FIG. 7 is a table illustrating possible configurations of amorphized and conductive paths. The table shows write commands used to form the corresponding configurations. The table shows the resulting input/output functionality (e.g., illustrated as a truth table) that can be implemented via the corresponding configurations of the reconfigurable device.

In an aspect, an example reconfigurable device can be configured to connect any pair of contacts (e.g., input terminals and output terminals). The reconfigurable device can also isolate the connection from the rest of the contacts (e.g., input terminals and output terminals). In an aspect, characteristic nucleation-growth dynamics approach can be used to form a nano-scale conducting path that is surrounded by an insulating amorphous region. For example, the amorphous region can heat up by the application of an electric filed. A nucleation process (e.g., creation of a crystalline portion) will start based on a probability of nucleation that relates to the raised temperature (e.g., higher probability in a certain temp range depending on the material used). The number of the formed nuclei can depend on the duration during which the amorphous region is heated to the high probability nucleation temp range. If the temperature is raised further to a growth temperature range, a growth process can become dominant and the formed nuclei can start growing to form a conductive path between contacts through which the electric filed is applied. The contacts (e.g., input terminals and output terminals) can be used for control signals and data signals. In an aspect, higher voltage control signals and/or synchronization can be used to form of conductive paths.

Figure 8A:
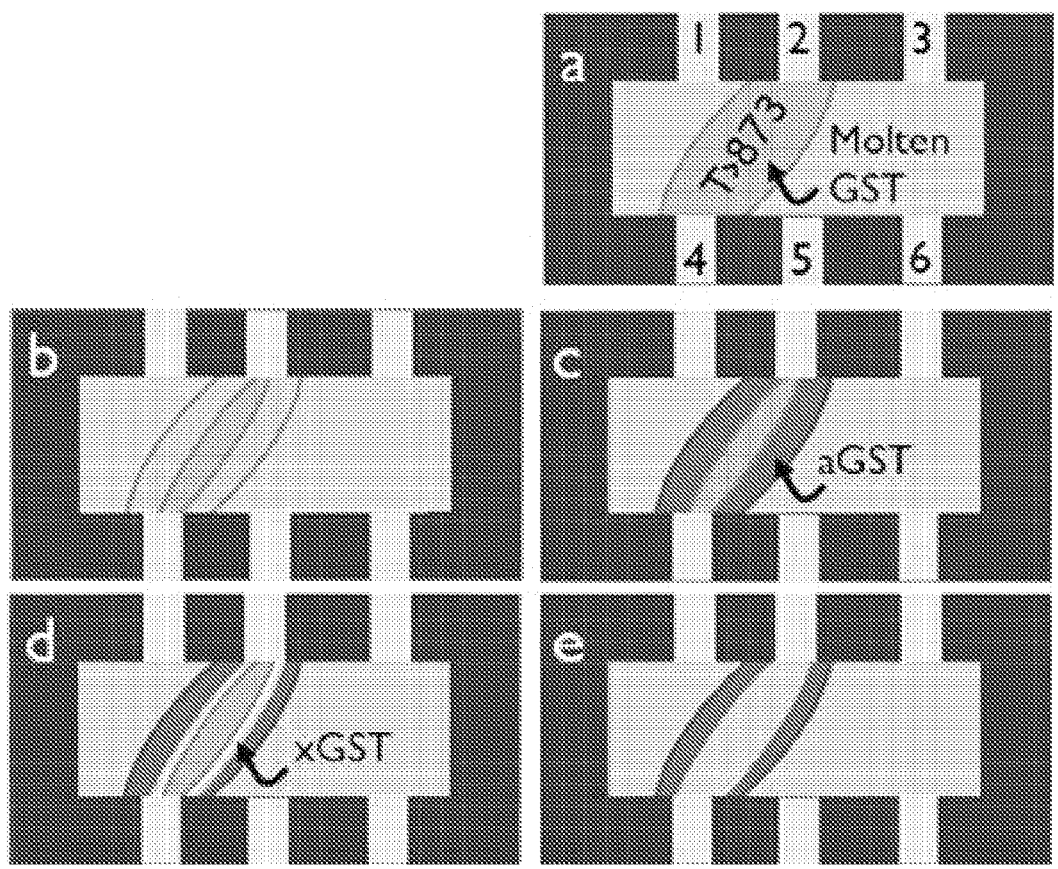
FIG. 8A is an illustration of connection formed by two contacts using a voltage pulse.
Figure 8B:
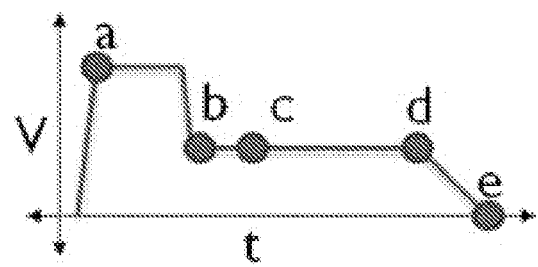
FIG. 8B is an illustration of voltage pulses used over time to configure the reconfigurable device as shown in FIG. 8A.

FIG. 8A and FIG. 8B illustrate an example process for forming a conductive path between two contacts of an example reconfigurable device. For example, the reconfigurable device can be configured to form a conductive path between a first contact and a second contact. First, a voltage pulse can be applied between the first contact and the second contact as shown in FIG. 8B. The voltage pulse can melt a wide path between the first contact and the second contact. Connection of two contacts in a crystalline GST block with a liquid filament can be turned into a coaxial structure of crystalline GST path enclosed in an amorphous insulation layer. In a 3D geometry, a large number of connections can be formed from a top contact array to the bottom contact array, limited by the density of the contacts. In an aspect, a new filament can avoid amorphized enclosure of the other filaments. In an aspect, thermal losses and heating profile can play an important role in formation of the connections. In an aspect, reconfigurable routing in small volumes can makes it difficult to reverse-engineer circuit structures using cross-sections and transmission electron microscopy (TEM) analysis, which can be useful for security applications.

In an aspect, the voltage applied between the first contact and the second contact can be reduced thereby leaving only the central part of the molten region as liquid (filament-retention) as shown in step (a). The portion of the melted region surrounding the liquid region can be amorphous, as shown in step (b).

In an aspect, the inner part of the amorphized region can start to crystallize via nucleation and growth as shown in step (c). The current applied between the first contact and the second contact can be gradually reduced to crystallize a core region via growth-from-melt template from the adjacent crystalline shell, as shown in step (d). The resulting core region can be a conductive path formed between the first contact and second contact. The conductive path can be surrounded with an insulating amorphous layer (shell).

Accordingly, the reconfigurable device can be used in resistive (i.e., non-volatile) memory technologies. The resistive memories can utilize reversible changes in resistance of a small volume of material. This resistance change can be achieved by magneto-resistance such as in magnetic RAM (MRAM) or by utilizing electro-thermal effects. In an aspect, large resistance contrast can be achieved by employing phase change material, giving rise to metal-insulator transition, as in phase-change memory (e.g., PCM or PCRAM).

In an aspect, the reconfigurable device can be used for computation. The reconfigurable device can be used for logic functions used in computation. For example, the reconfigurable device can be integrated into a computing circuit, such as a general purpose CPU, field programmable gate array (FPGA), application specific integrated circuits (ASICS), and/or the like. For example, a typical CPU may cost more and consume more power than a FPGA or ASIC, but the CPU may offer the most flexibility. Power consumption can be significantly lowered by integration of the reconfigurable device with such computing device. Such integration may reducing leakage and enable efficient hibernation without accessing off-chip memory.

In another aspect, the reconfigurable device can be used as a component of switches as well as components in neural networks. For example, the reconfigurable device can be configured to implement functions and reconfigurable routing. In another aspect, the reconfigurable device can be implemented with a CMOS configuration. This hybrid phase-change and CMOS approach can have the potential to utilize non-volatility of phase change elements of the reconfigurable device and inherit amplification of CMOS for low-power computation. In an aspect, the reconfigurable device can utilize materials and concepts used for phase change memory elements in alternative geometries (e.g., tube) that enable functional implementation. The reconfigurable device can be integrated with CMOS elements to map functions and/or enable reconfigurable routing of signals. As such, the endurance of PCM elements can be significantly improved, enabling use of the reconfigurable device for efficient and non-volatile programming of logic operations.

Figure 9:
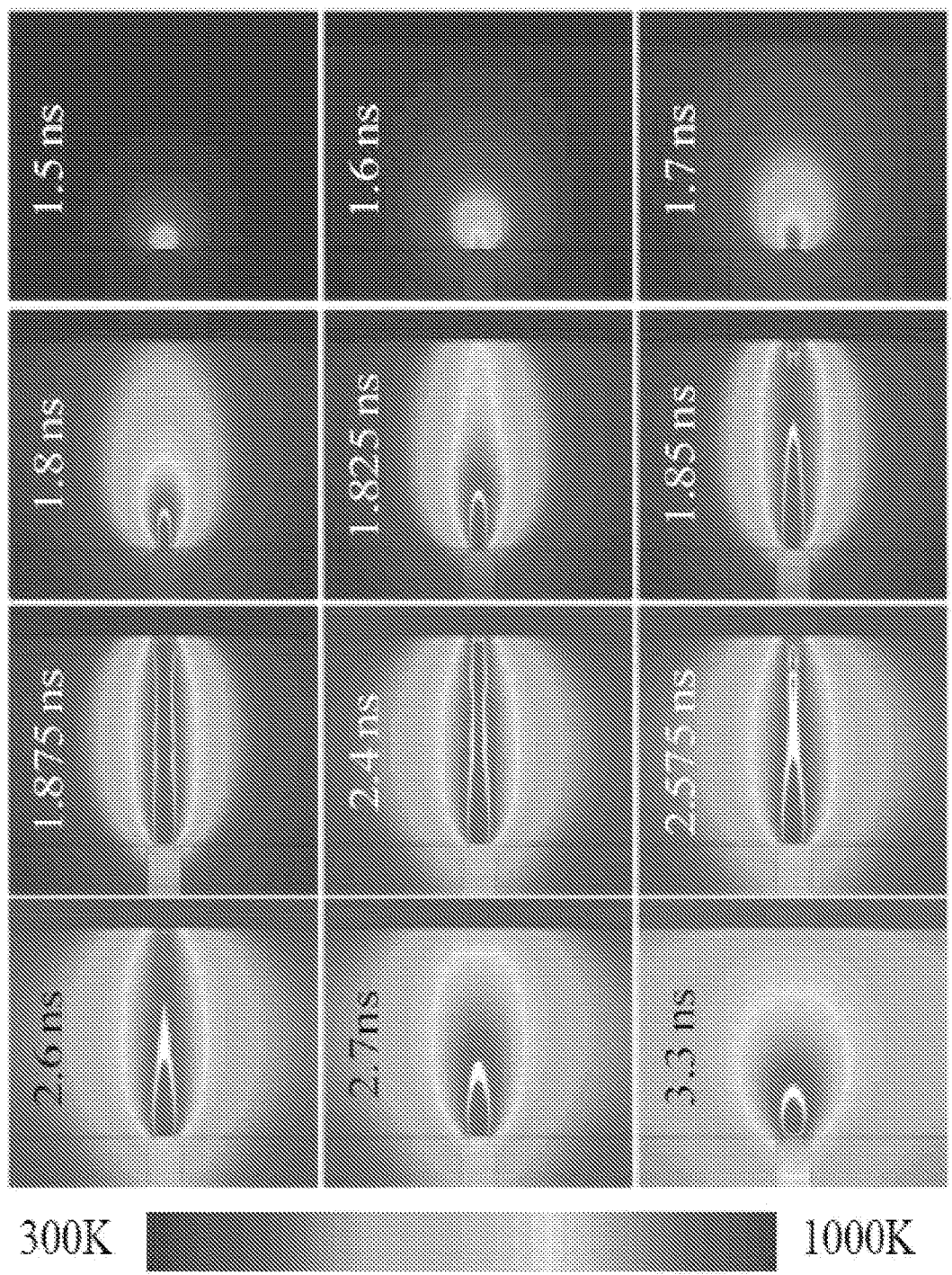
FIG. 9 illustrates a thermal profile for a PCM cell simulated using 2D rotational symmetry showing the filament formation.

FIG. 9 illustrates the formation of a conductive filament in an example reconfigurable device. Thermal profiles are shown over time (e.g., starting in time at the top left and ending at the bottom right). The thermal profiles of the reconfigurable device are simulated using 2D rotational symmetry. The thermal profiles illustrate thermal runaway and filament formation during reset with a rise time (e.g., 0.5 ns). In this scenario, the rise time is not enough for heat to diffuse sufficiently within the phase change material. As the heat diffuses, the filament can retract (e.g., shrink). The volume experiencing melting (e.g., white contours) can be amorphized upon resolidification. Though the reconfigurable device is not limited to such configuration, the bottom contact can have a diameter of 12 nm and the reconfigurable layer can be biased through a field effect transistor (FET).

Figure 10:
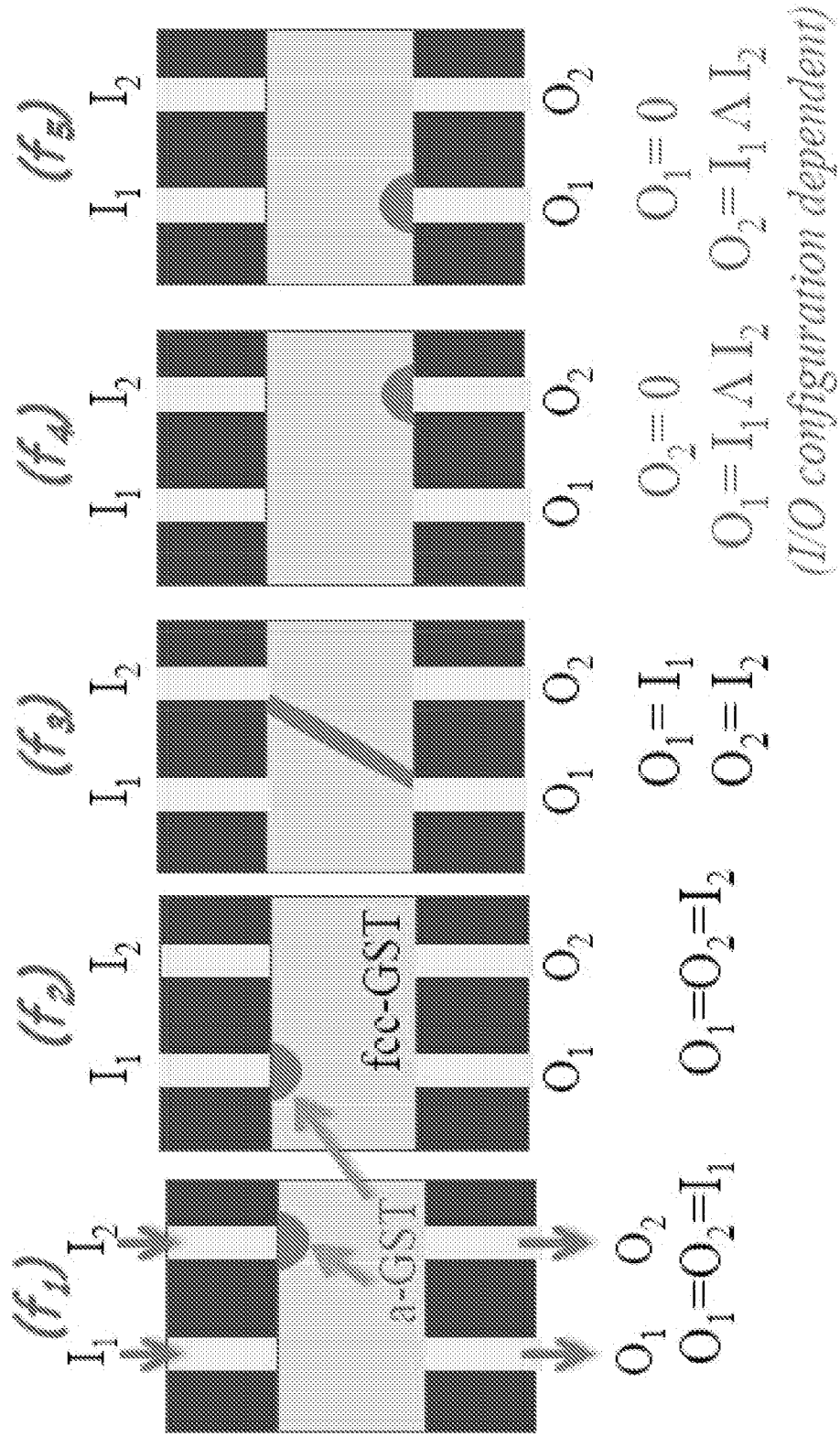
FIG. 10 illustrates a two-in put two-output phase-change device implementing 5 distinct functions.

FIG. 10 illustrates an example reconfigurable device. The reconfigurable device can comprise a two-input two-output phase-change device implementing 5 distinct functions illustrated as a first function ($f_1$), a second function ($f_2$), a third function ($f_3$), a fourth function ($f_4$), and a fifth function ($f_5$). The first function can provide a signal to outputs $O_1$ and $O_2$ based on a signal supplied to input $I_1$. The second function can provide a signal to outputs $O_1$ and $O_2$ based on a signal supplied to input $I_2$. The third function can provide the input $I_1$ to the output $O_1$ and the input $I_2$ to the output $O_2$. The fourth function can provide no output from output $O_2$ while providing signals from $I_1$ and $I_1$ to output $O_1$. The fifth function can provide no output from Output $O_1$ while providing signals from $I_1$ and $I_1$ to output $O_1$.

In aspect, the reconfigurable device can be configured to perform one or more of these functions based on formation of amorphous regions around or otherwise proximate to one or more of the contacts. For example, amorphous regions can be formed to isolate different contacts to configure the reconfigurable device for functions $f_1$, $f_2$, $f_4$, and $f_5$. For function $f_1$, input $I_2$ is isolated from the other input and outputs. For function $f_2$, input $I_1$ is isolated from the other input and outputs. For function $f_4$, output $O_2$ is isolated from the other input and outputs. For function $f_5$, output $O_1$ is isolated from the other input and outputs.

In an aspect, the reconfigurable device can be configured to perform these functions based on filament formation. For example, filament formation between various contacts can be utilized to melt and amorphize different paths in a multi-contact geometry, enabling multi-input multi-output device configurations. For example, function $f_3$ can be implemented by forming a filament, path, line and/or the like between output contact $O_1$ and input contact $I_2$. By way of explanation, the reconfigurable device can comprise a reconfigurable layer, such as a substantially two-dimensional thin film. If the thickness of the reconfigurable layer is much smaller than the other two dimensions of the reconfigurable layer, two or more sections of the plane can be isolated from each other using amorphized lines in the reconfigurable layer of the reconfigurable device.

In an aspect, output of function $f_4$ and $f_5$ can depend on access devices and terminal configurations. For example, if the reconfigurable device is read by passing current then a different functionality is achieved based on the inputs states.

A thermal runaway and a conductive filament can be formed if the reconfigurable device is operated above a threshold speed. Functions can be written by controlling the voltage levels, rise-times and durations. For example, the time constants associated with heat diffusion can be $10^{-9}$ to $10^{-8}$ seconds.

Figure 11A:
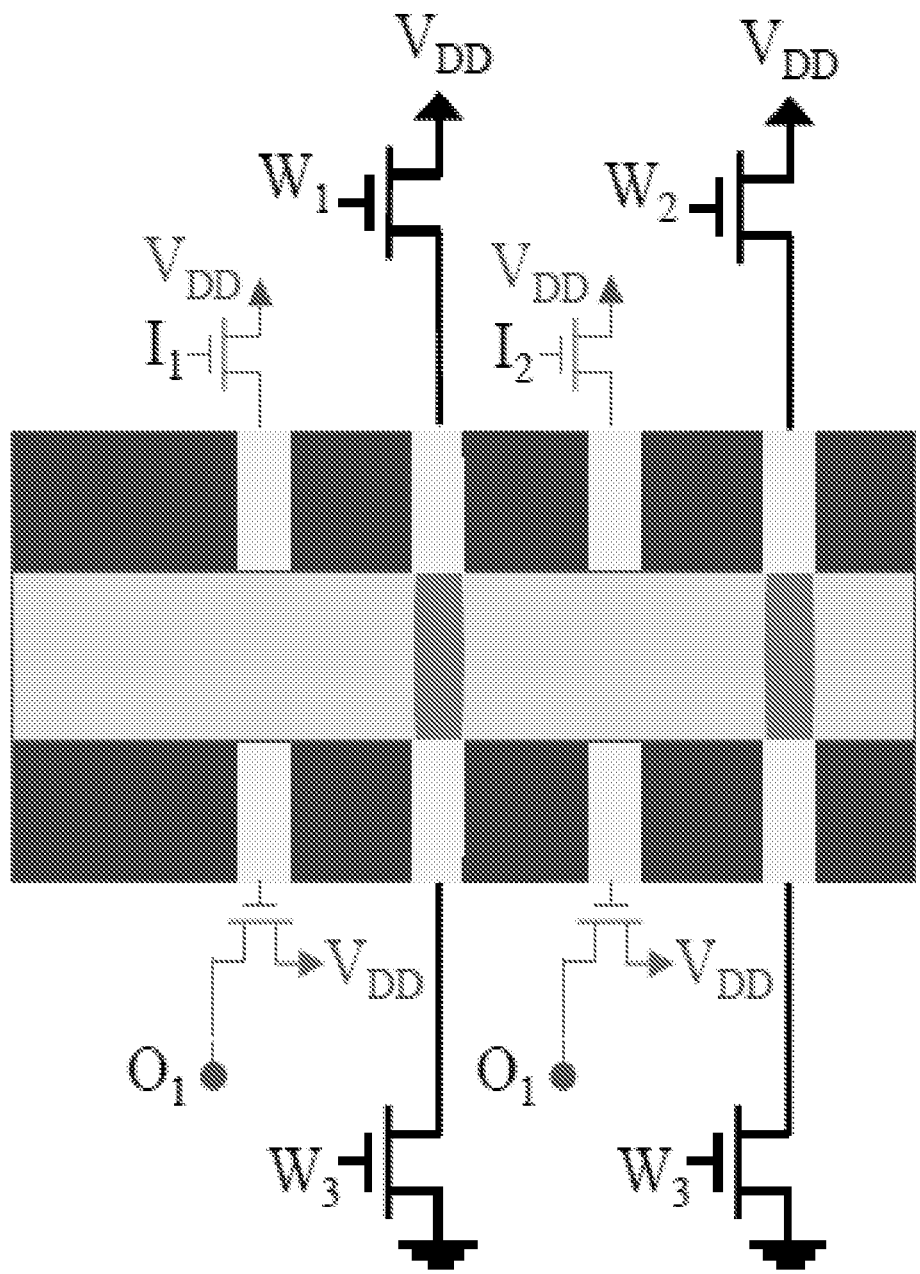
FIG. 11A illustrates an 8-contact reconfigurable device in a first state.
Figure 11B:
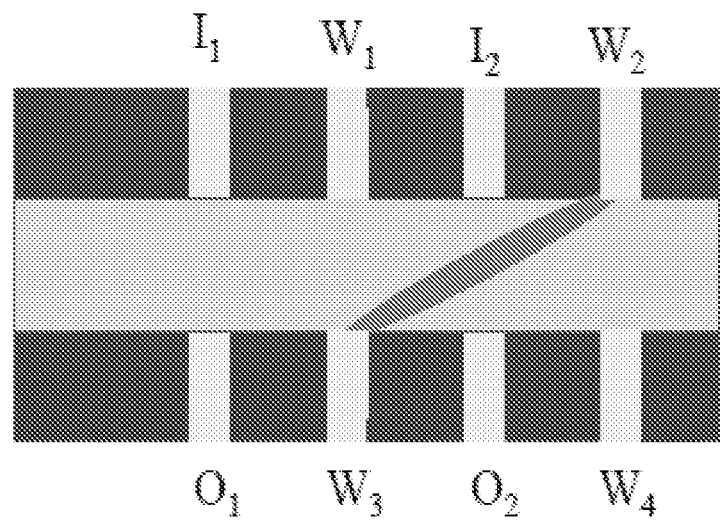
FIG. 11B illustrates an 8-contact reconfigurable device in a second state.
Figure 11C:
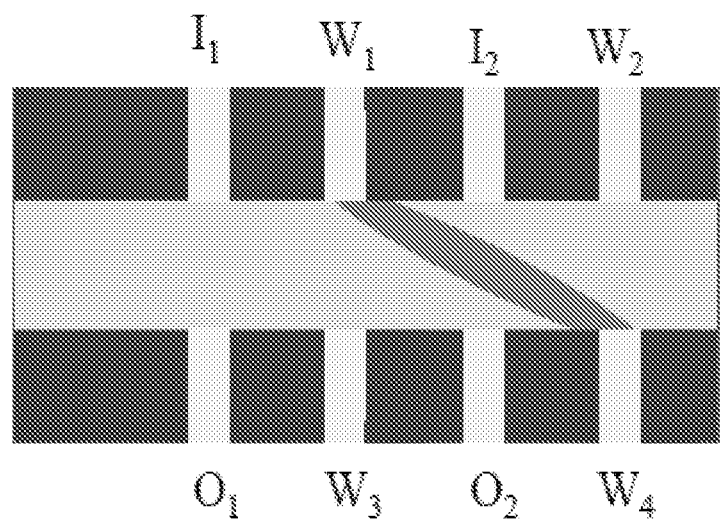
FIG. 11C illustrates an 8-contact reconfigurable device in a third state.

FIG. 11A, FIG. 11B, and FIG. 11C illustrate an 8-contact phase-change device with 2-inputs, 2-outputs and 4-write terminals. In an aspect, a rectangular reconfigurable layer (e.g., a GST patch) can be in contact or otherwise be electrically coupled with two input terminals on a first side of the reconfigurable layer and two output terminals on a second side of the reconfigurable layer. The geometry can allow for isolation of one or both of the input terminals or the output terminals, and thus, functionalization. In an aspect, the input terminals can be used for write operations.

The rise times and voltage (or current) can be controlled for the reset operation. A read can be achieved using a lower voltage (e.g., in the order of 100 mV). The device can give all the functionality of a two-input, two output configuration other than the swap function (e.g., swap: $Output_1=Input_2$, $Output_2=Input_1$), implementing 5 unique configurations. Access FETs for inputs and outputs can be scalable depending on the fan-out configuration, and not limited by reset current requirements. Hence the block with access FETs can be smaller than 8 PCM cells with access FETs. Functions can be written by turning on pairs of write terminals. Three sample functions are shown where the amorphized path (dark color) is used to isolate terminals.

In an aspect, input/output devices can be fabricated to implement combinations of three or more inputs and outputs. The implementation can depend on how CMOS is integrated with the input of the devices. For example, input signals can be connected to the gate of one or more access transistors or directly into the reconfigurable device resulting in slightly different write operation and truth table. Alternatively, the devices can be configured to have dedicated write terminals and read terminals as shown in FIG. 11A, FIG. 11B, and FIG. 11C. Write operations, which reconfigure the reconfigurable layer, can be performed by the dedicated terminals. Read operations can be performed by the input and output terminals.

In an aspect, an example reconfigurable device can comprise four dedicated write terminals (e.g., with two input terminals and two output terminals). The reconfigurable device can thus, comprise an 8 terminal structure configured for a 2-bit operation. Such configuration (e.g., having dedicated write terminals) can reduce the complexity associated with the write and read operations and allow for easier integration with digital (binary) CMOS, which has rail to rail operation (inputs and outputs are either high (1) or low (0)). The dimension restrictions on a plurality of input transistors and output transistors can be alleviated, and fan-in and fan-out can be implemented relatively easily. Superior functionality can be achieved by using the write terminals, which enable implementation of a swap function in which each of input terminals can be connected to either one of the output terminals.

In an aspect, the reconfigurable device can be configured to change its configuration through a consistent clock/control signal. For example, the reconfigurable device can work as a 2×1 non-volatile signal multiplexer, such as a T-Flip-flop, which is a fundamental building block of digital electronic system used in computers and communication systems. In an aspect, the reconfigurable device can comprise a reconfigurable layer. The reconfigurable layer can comprise a substantially two-dimensional thin film in a rectangular shape (e.g., assuming the thickness of the film is much smaller compared with the other two dimensions).

As an example, the reconfigurable device can be built such that a plurality of (e.g., six) contacts (e.g., metal contacts) can be interfaced with a plurality of (e.g., five) transistors. The plurality (e.g., six) of contacts can comprise control terminals (e.g., two), input terminals (e.g., two) and/or output terminals (e.g., two).

In an aspect, the reconfigurable device can comprise a plurality of transistors. For example, the control terminals can be connected to a single transistor (e.g., NMOS), while the two input terminals and the two output terminals can be connected to four corresponding transistors (e.g., PMOS). In an aspect, PMOS and NMOS can be interchanged.

When a first control signal is sent, a potential difference can be formed between two control terminals across the reconfigurable layer and two equally probable paths of currents can be formed. Due to material non-uniform nature and process variations, one of the two paths can take over and short circuit the other path, leading to asymmetric melting between the two control terminals. A highly resistive amorphous path can be then formed during rapidly cooling of molten volume. The amorphous path can isolate one input terminal from the output terminals. The other input terminal can remain connected to the output terminals by the crystalline phase change material. When a second control signal is sent, a current can flow between intact control terminals as it has a more conductive current path. For example, the first control signal and the second control signal can be the same. This signal can be applied to the same set of contacts. However, each time the signal is provided, the signal can adjusts, modify, reconfigure, and/or otherwise change the device to a different state. For example, the reconfigurable device can toggle between two states (e.g., because of the thermal crosstalk). The previously amorphized path can then crystallize if the second control signal is maintained for sufficient time (e.g., because of thermal crosstalk). Accordingly, the other input terminal can be connected to the output terminals. This process can be repeated every time a control pulse is sent, leading to toggling the input terminals. In an aspect, simulation results show successive cycles with consistent behavior. The pulse durations and fall-times can be designed along with the geometry to achieve desired performance. It should be noted that, although the simulation results are shown for certain transistor types, the reconfigurable device can be operable with a different phase change material and transistor configuration. For example, a different number of contacts, arrangements, and dimensions can be used in the reconfigurable device. In an aspect, the reconfigurable device can comprise different phase change materials, such as $Ge_2Sb_2Te_5$ (GST), GeSb, GeTe, SbTe and other chalcogenides.

In an aspect, the reconfigurable device can be used to implement logic in general purpose CPUs, field programmable gate arrays (FPGAs) or application specific integrated circuits (ASICS). The reconfigurable device can reduce power requirements for such devices. Along with the reduction in power, performance can be significantly boosted by increased capacity for parallel computations. For example, use of the reconfigurable device can allow for a large-density of non-volatile elements to be integrated with a CPU, FPGA, ASIC, and/or the like.

In an aspect, phase-change elements can be used as switches as well as part of neural network. Multi-contact phase change elements can permit implementation of functions and reconfigurable routing, going beyond PCM use for look-up tables. In an aspect, complementing CMOS with phase-change elements can offer significant advantages over conventional CMOS in circuit footprint (area) and standby power. In an aspect, the disclosed multi-contact phase-change device can perform multiplexing and data routing.

In an aspect, an example reconfigurable device can be configured as multiplexer. For example, the reconfigurable device can be configured to switch between different outputs. In an aspect, the reconfigurable device can comprise a reconfigurable layer, such as a 2D-planar phase-change patch. The reconfigurable device can be implemented with at least two slightly different geometries (e.g., 6 contacts or 7 contacts). The reconfigurable layer can be interfaced with 5 CMOS transistors (toggle-multiplexer) capable of achieving 2-input, 1-output multiplexing using 1-control terminal with a total of 6 or 7 contacts as shown in FIG. 12A and FIG. 13.

Figure 12B:
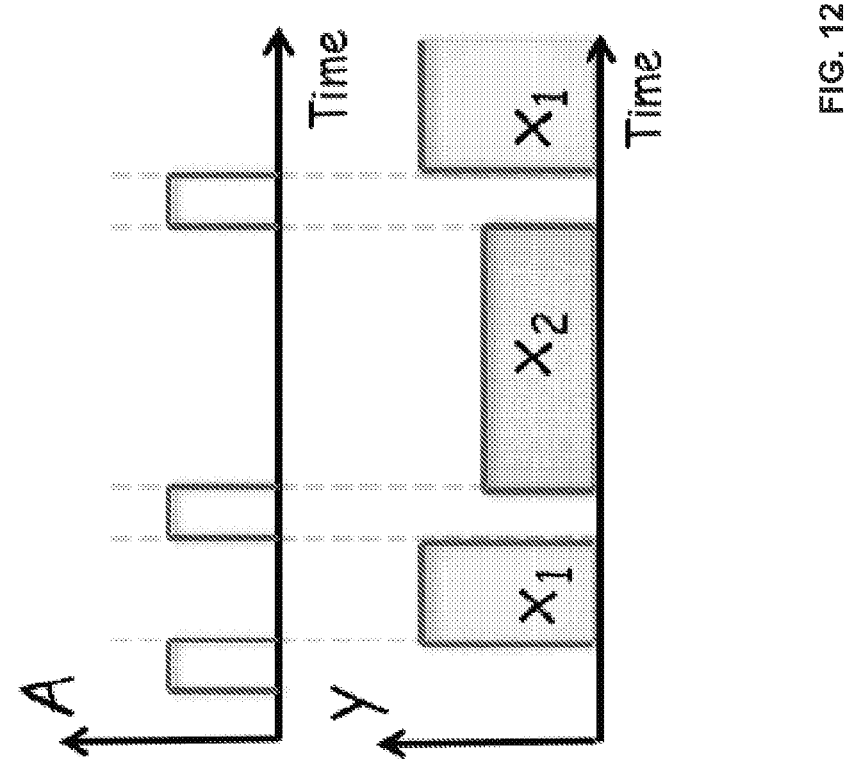
FIG. 12B illustrates input and output signals for an example multiplexer.
Figure 12A:
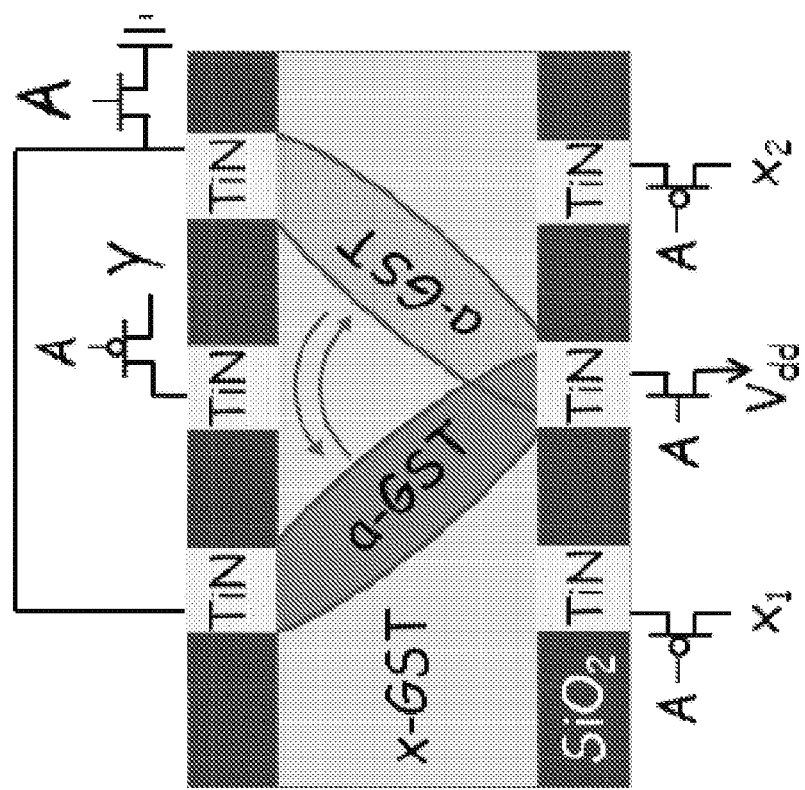
FIG. 12A illustrates a 2-input one output toggle multiplexer using a single control input.
Figure 13:
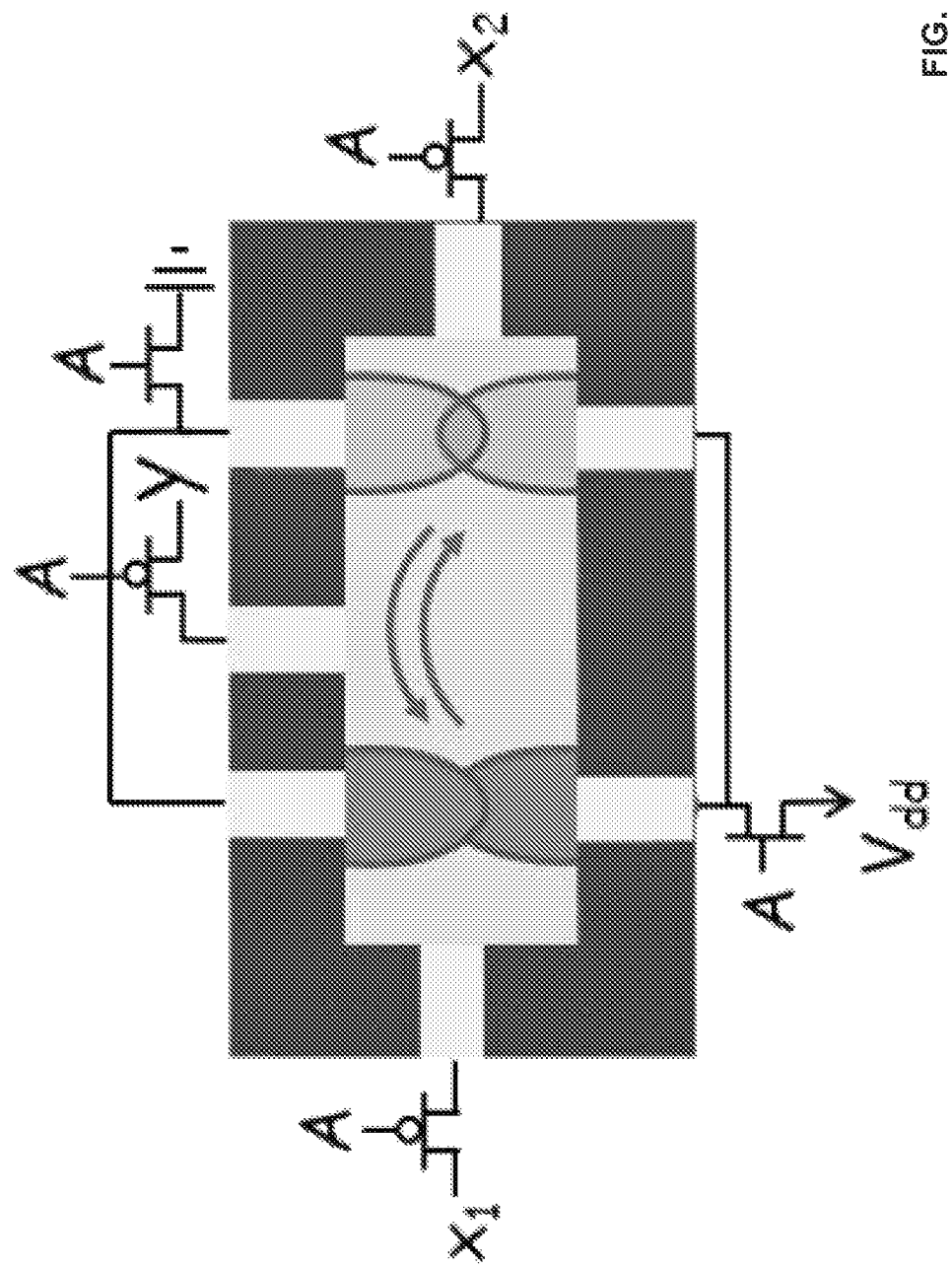
FIG. 13 illustrates a reconfigurable device having 7 contacts.

For example, FIG. 12A and FIG. 12B illustrate a 2-input (e.g., $X_1$, $X_2$), one output (e.g., Y) toggle multiplexer using a single control input (A). As another example, FIG. 13 illustrates a reconfigurable device with a 7 contact arrangement with a narrow GST patch.

Figure 14:
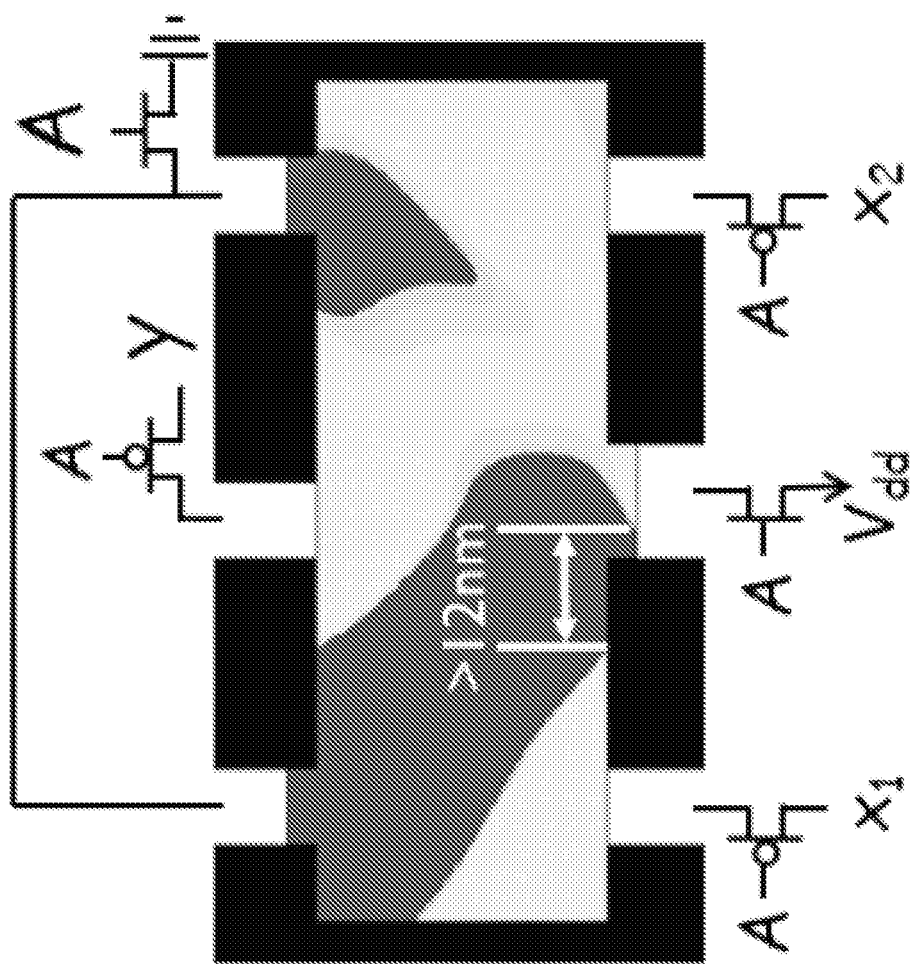
FIG. 14 illustrates a resistivity map showing connectivity after several toggle operations.

FIG. 14 illustrates a resistivity map showing connectivity after several toggle operations. In an aspect, the reconfigurable device can be configured to switch between two different amorphized paths. In some configurations, the reconfigurable device can be configured to amorphize only one path at a time. As an illustration, the reconfigurable device can amorphize a first path within the reconfigurable layer. Then, the reconfigurable device can amorphize a second path within the reconfigurable layer. During amorphization of the second path, the first path recrystallizes. The output can toggle from one input to the other with incoming control pulses.

In an aspect, the reconfigurable device can be configured as a T-flip-flop. For example, with fixed 0, 1 inputs, the reconfigurable device can act as a T-flip-flop. The T-flip-flop implemented by the reconfigurable device can have approximately 50% less footprint compared to a conventional CMOS T-flip-flop with an additional advantage of non-volatility (allowing intermittent use/power).

In an aspect, in a geometry shown in FIG. 12A, an example reconfigurable device can comprise nFETs to control the control (e.g., write) terminals. The reconfigurable layer can comprise pFETs to control the data (e.g., read) terminals. It should be noted, that a read operation can be disabled during reconfiguration of the reconfigurable layer. In some scenarios, gates of the FETs can share the same control signal (A). When a control pulse is received in A, a more conductive path can self-heat and melt. During this process, the amorphized regions (darker color) can recrystallize as shown in FIG. 14. As the pulse is terminated, a molten region can be amorphized, hence in a high-resistance state, a toggle operation can be achieved.

Figure 15:
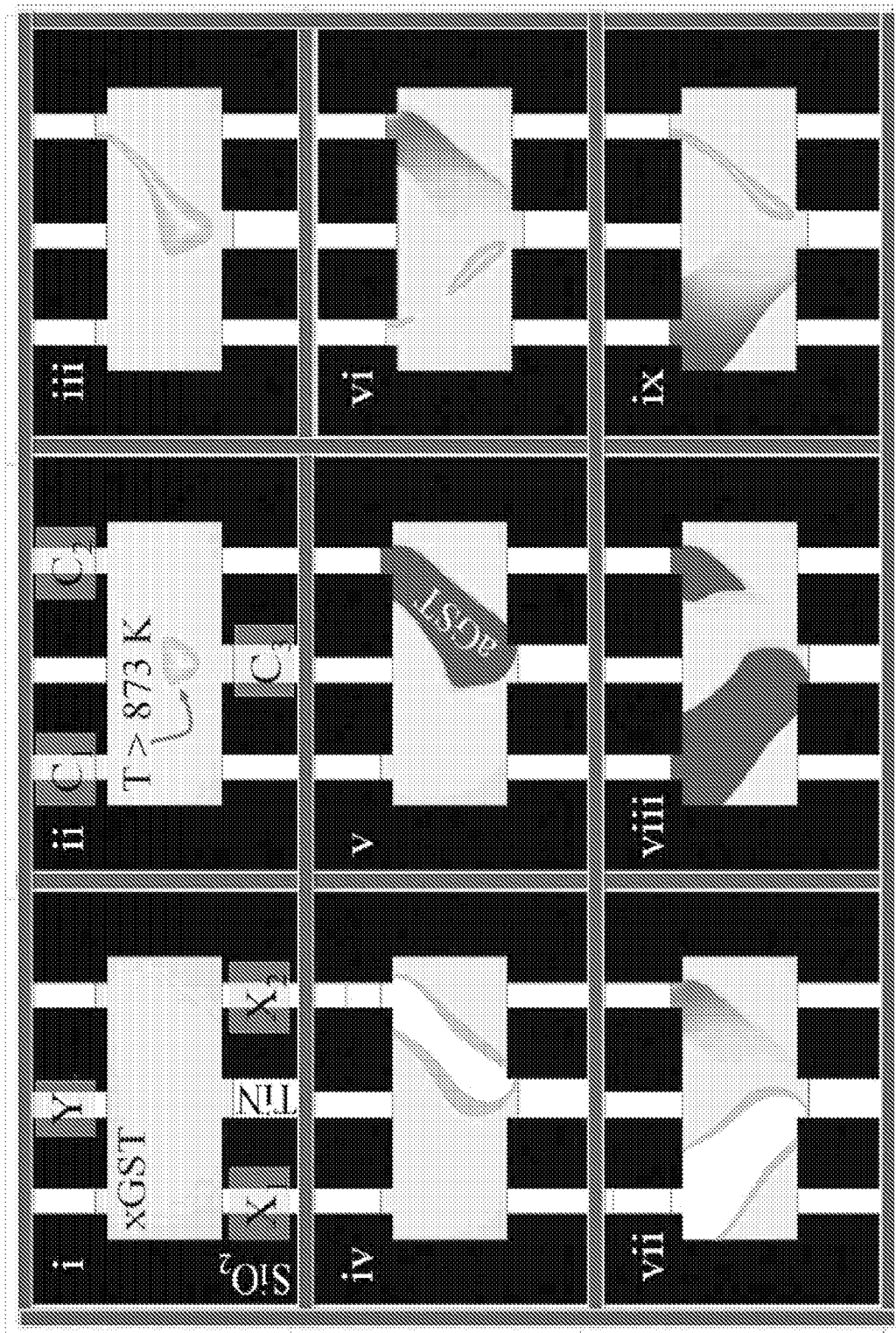
FIG. 15 illustrates conductivity maps for stages of an electro-thermal simulation for a toggle operation.

FIG. 15 illustrates frames of a conductivity map from an electro-thermal simulation for a toggle operation of the reconfigurable device. Lighter colors are more conductive. The gray contour lines highlight the boundary of the molten regions. As shown in steps (i)-(iv), the reconfigurable device can be initialized in a crystalline state and a molten filament can be formed between $C_2$ and $C_3$, leaving an amorphized region at the end of the pulse, as shown in step (v), setting the multiplexer to $Y=X_1$ state. A second pulse (e.g., identical to the first) can form a molten path between $C_1$ and $C_3$ and crystallize previously amorphized areas, as shown in steps (vi)-(vii). With termination of the pulse, a multiplexer can be set to $Y=X_2$ state and one cycle of toggle operation can be achieved, as shown in step (viii). In an aspect, cycles can continue in the same fashion, as shown in step (ix). Simulation results show successive cycles with consistent behavior. Pulse durations and fall-times can be designed along with geometry to achieve desired performance.

In an aspect, a reconfigurable device with bottom metal contacts can be fabricated. The bottom metal contacts can be fabricated using trench formation (e.g., photo-lithography and reactive ion etching (RIE)), metal deposition and chemical mechanical polishing (CMP). As an example, GST thin films can be deposited using atomic layer deposition (ALD) and get capped with $SiO_2$ (ALD).

In an aspect, the disclosed reconfigurable device can be integrated with Silicon based CMOS. In an aspect, silicon based CMOS devices can be fabricated for the control circuitry to test accurate evaluation of circuit performances. The redesign can include improvements based on experiences in the earlier phases. CMOS flow may require additional lithography steps.

In an aspect, the reconfigurable device can be formed as follows. A phase change material, such as GST, can be deposited using atomic layer deposition (ALD). Atomic layer deposition (ALD) is a conformal thin film deposition technique which can provide atomic layer control by using sequential release of gas phase precursors. The deposition can comprise repeated sequences of pulse-purge cycles of each precursor. The cycle can start with exposure of a first precursor, followed by reaction and purge (e.g., evacuation) of the reaction chamber to remove non-reacted and excess gases. Each reaction cycle can add a certain amount of material (e.g., growth-rate) on a surface. Growth rate can be controlled by cycle duration and precursor gas concentrations, temperature and simultaneous exposure of the precursors. Self-limiting surface reaction can help control of layer-by-layer deposition of a thin film, and low deposition temperature can make it compatible with back-end-of-line processing. The phase change material can further be annealed for densification.

In an aspect, successful deposition of GST thin films using ALD can be achieved for phase change memory. Precursor sets of $Ge(N(CH_3)_2)_4$, $Sb(N(CH_3)_2)_4$, $Te(i-Pr)_2$ and $(Et_3Si)_2Te$, $SbCl_3$, $GeCl_2 \cdot C_4HgO_2$ can be used for GeSbTe deposition. In an aspect, stoichiometric $Ge_2Sb_2Te_5$ can be deposited by adjusting the exposure times and ratio of the binary cycles Ge—Te and Sb—Te.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

Figure 16A:
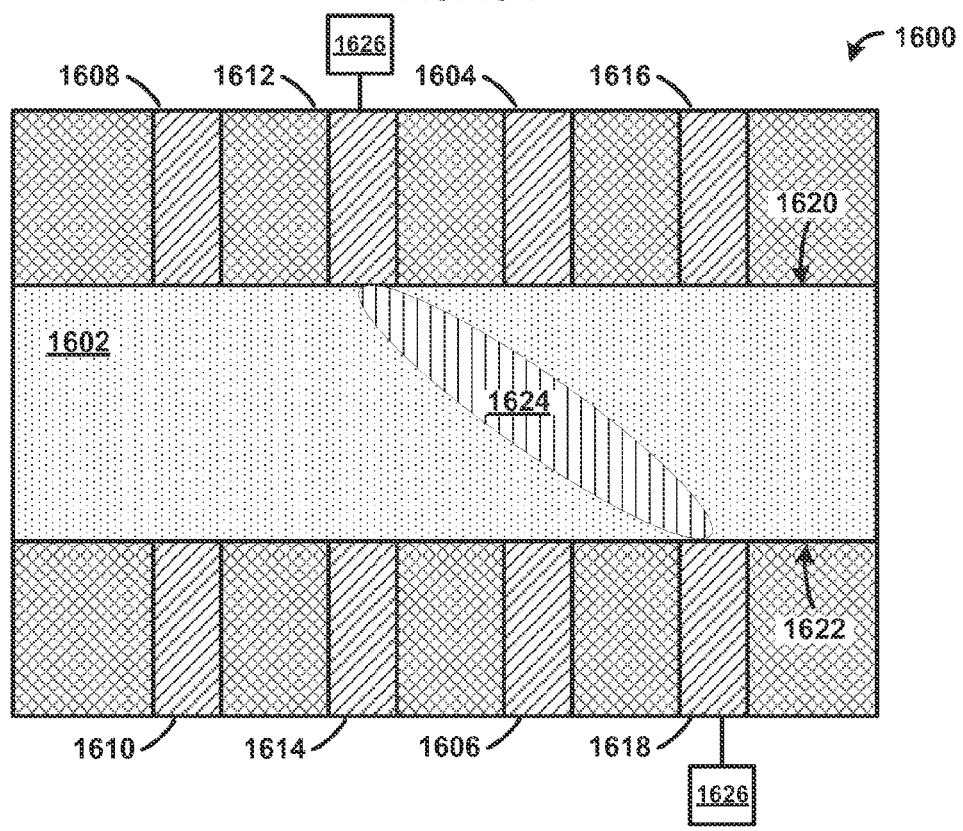
FIG. 16A is a block diagram illustrating an example reconfigurable device.

FIG. 16A is a block diagram illustrating an example reconfigurable device 1600. In an aspect, the reconfigurable device 1600 can be configured as a toggle device, a flip-flop device, a signal multiplexer, or a combination thereof. In an aspect, the reconfigurable device 1600 can comprise a reconfigurable layer 1602. The reconfigurable layer 1602 can comprise a phase change material. In an aspect, the reconfigurable layer 1602 can be a structure, such as a three-dimensional structure. For example, the reconfigurable layer can comprise a cube structure, cylindrical structure, pyramidal structure. The reconfigurable layer 1602 can be a substantially two-dimensional structure. For example, the reconfigurable layer 1602 can comprise a planar structure, a thin film, and/or the like. The phase change material can comprise a chalcogenide alloy.

In an aspect, the reconfigurable layer can comprise a closed surface surrounding, along at least one axis, a region at least partially enclosed by the reconfigurable layer. For example, the reconfigurable layer can at least partially surround and/or enclose (e.g., along one or more axis) a region. The region can comprise a cavity, an insulating layer, and/or the like. For example, the reconfigurable layer 1602 can be formed as a tube (e.g., a pipe) or otherwise wrapped, distorted, twisted, and/or the like. The reconfigurable layer 1602 can comprise a closed surface with an open top and/or open bottom. For example, the reconfigurable layer can comprise a four sided cube (e.g., partially surrounded the region). The cube can be hollow. The four sided cube can be with a top or bottom. The reconfigurable layer can comprise a pyramidal structure (e.g., without a top or bottom). It should be noted that though the reconfigurable layer 1602 is shown with a left side and a right side, in some scenarios, the left side and right side can be seamlessly connected to form a three-dimensional structure (e.g., as shown in FIG. 3).

The reconfigurable device 1600 can comprise a set of contacts (e.g., terminals, electrodes). The set of contacts can comprise at least a first contact 1604, a second contact 1606, and a third contact 1608. The set of contacts can comprise a fourth contact 1610, fifth contact 1612, sixth contact 1614, seventh contact 1616, eighth contact 1618, and/or the like. The one or more contacts can be conductive. The one or more contacts can be composed of a conductive material, such as Titanium Nitride (TiN) or other metal.

In an aspect, the set of contacts can be electrically connected (e.g., coupled) and/or otherwise attached (e.g., connected) to the reconfigurable layer 1602. For example, an edge of one or more (or each) of the contacts of the set of contacts can be in contact with a first side 1620 of the reconfigurable layer 1602. In an aspect, the set of contacts can comprise at least a first contact, a second contact, and a third contact. The first contact 1604 can be an input contact, an output contact, and/or a control contact (e.g., contact configured to write and erase amorphous regions). The second contact 1606 can be an input contact, an output contact, and/or a control contact. The third contact 1608 can be an input contact, an output contact, and/or a control contact. For example, input contacts can provide signals (e.g., currents) into the reconfigurable layer 1602. Output contacts can receive signals (e.g., currents) from the reconfigurable layer 1602. Control contacts can be configured to modify the reconfigurable layer 1602 by providing write and reset commands, signals, and/or the like to the reconfigurable layer 1602. Control contacts can form amorphous regions, such as the first amorphous region 1624. Control contacts can also cause amorphous regions to change to a crystalline form and/or liquid form.

In an aspect, the first contact 1604 can be positioned directly across or diagonally across the reconfigurable layer 1602 from the second contact 1606. The first contact 1604 and the third contact 1608 can be located on a first side 1620 (e.g. top) of the reconfigurable layer 1602. The second contact 1606 can be located on a second side 1622 (e.g., bottom) of the reconfigurable layer 1602. The first side 1620 can be opposite from the second side 1622. For example, the first side 1620 can comprise a top of the tube. The second side 1622 can comprise a bottom of the tube.

The reconfigurable device 1600 can comprise at least one control element 1626 electrically coupled to one or more of the set of contacts. It should be noted, that though only two control elements 1626 are shown, it is contemplated that each contact of the set of contacts can be electrically connected to a control element as illustrated elsewhere herein. Furthermore, multiple contacts can be connected to a single control element as illustrated elsewhere herein. For example, the at least one control element 1626 can comprise one or more transistors configured to supply signals (e.g., current, voltage) to one or more of the contacts. The at least one control element 1626 can be configured to supply the first control signal to one or more of the set of contacts. The first control signal can be configured to modify a first portion of the reconfigurable layer 1602 thereby isolating the first contact 1604 from the second contact 1606 and/or the third contact 1608. For example, the first control signal can be configured to isolate the first contact 1604 from the second contact 1606 by forming a region of amorphous phase change material within the reconfigurable layer 1602.

In another aspect, PMOS and NMOS can be utilized to isolate control operation and toggle as described herein. For example, the at least one control element 1626 can comprise a plurality of transistors. For example, the control contacts can be connected to a single transistor (e.g., NMOS), while the input contacts and the output contacts can be connected to four corresponding transistors (e.g., PMOS). In an aspect, PMOS and NMOS can be interchanged.

In some scenarios, the first control signal can be configured to form a crystalline path between two contacts, as shown in FIG. 8A. For example, the first amorphous region 1624 can be modified to contain a conductive path (e.g., crystalline path). The conductive path can be at least partially encased in the first amorphous region. An outer layer of the first amorphous region 1624 can be configured to isolate the crystalline path from other contacts, such as the first contact 1604, the second contact 1606, the third contact 1608, and/or the fourth contact 1610.

In an aspect, the set of contacts can comprise one or more control contacts. For example, the fifth contact 1612, sixth contact 1614, seventh contact 1616, eighth contact 1618 can be configured as control contacts. For example, the fifth contact 1612 can be configured a form a first amorphous region 1624 in the reconfigurable layer 1602 along a pathway between the fifth contact 1612 and the eighth contact 1618. For example, the first amorphous region 1624 can be formed along a line, path, or barrier from one contact to another contact. The first amorphous region 1624 can isolate an input contact (e.g., first contact 1604, third contact 1608) from one or more output contacts (e.g., second contact 1606, fourth contact 1610). The first amorphous region 1624 can isolate an output contact (e.g., second contact 1606, fourth contact 1610) from one or more input contacts (e.g., first contact 1604, third contact 1608).

It should be noted that any of contacts of the set of contacts can be configured as control contacts. The control contacts can be configured as input and/or ouput contacts to send and receive signals, such as data signals. The first amorphous region 1624 can extend between an input contact and an output contact (e.g., as shown in FIG. 12A, FIG. 12B, and FIG. 13). The first amorphous region 1624 can also extend between two control contacts.

Figure 16B:
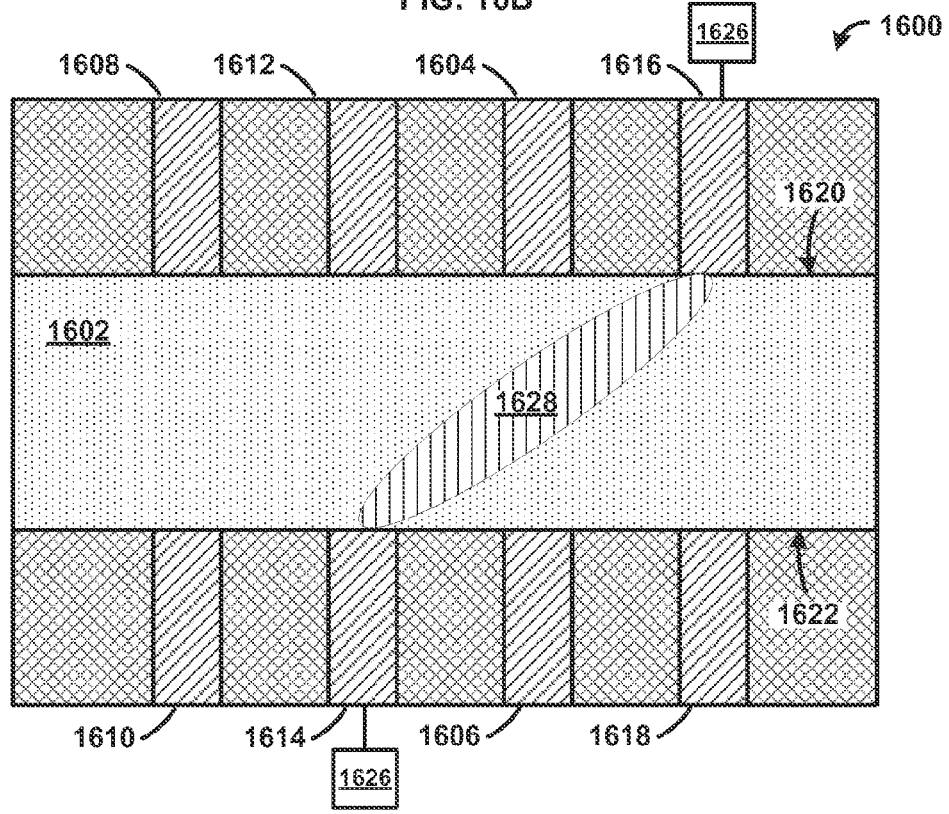
FIG. 16B is a block diagram illustrating the example reconfigurable device after reconfiguration.

FIG. 16B is a block diagram illustrating the example reconfigurable device 1600 after an example reconfiguration. The at least one control element 1626 can be configured to switch the reconfigurable device 1600 (e.g., and reconfigurable layer 1602) from a first state (e.g., shown in FIG. 16A) to a second state. For example, the at least one control element 1626 can be configured to supply a second control signal to one or more of the set of contacts. The reconfigurable layer 1602 can be modified by applying a second control signal to one or more of the set of contacts electrically connected to the reconfigurable layer 1602. The second control signal can change which of the set of contacts are isolated or not isolated. For example, the second control signal can be supplied to the sixth contact 1614 and the seventh contact 1616. The second control signal can be configured to isolate the third contact 1608 from the second contact 1606.

In an aspect, the second control signal can be configured to modify the reconfigurable layer 1602 by forming a second amorphous region 1628. The second amorphous region 1628 can be formed along a path, line, and/or the like between two of the contacts of the set of contacts (e.g., sixth contact 1614 and seventh contact 1616). The second control signal can be configured to remove at least a portion of the first amorphous region 1624 formed in step 1702 (e.g., causing the first contact to no longer be isolated from the second contact). For example, the second control signal can cause the first amorphous region 1624 to recrystallize.

It should be noted, that the at least one control element 1626 can be configured to switch the reconfigurable device 1600 to a plurality of other states and configurations as described throughout the present disclosure. For example, a third control signal can be configured to isolate the fourth contact 1610 from one or more of the first contact 1604 and the third contact 1608. Amorphous regions can be formed (e.g., as path, barrier) between the fifth contact 1612 and the sixth contact 1614, between the seventh contact 1616 and the eight contact, and/or the like. Amorphous regions can be formed as a plug around, in front of, or otherwise blocking a single contact. Amorphous regions can also be formed between input contacts and output contacts (e.g., between the first contact 1604 and the second contact 1606, between the third contact 1608 and the fourth contact 1610).

In an aspect, the reconfigurable device 1600 can be configured based on thermal runaway, cross talk (e.g., thermal cross talk), specialized geometry, and/or the like. For example, the set of contacts can be configured to cause at least a first path in the medium and a second path in the medium. The first path can be between an output contact and an input contact, such as between the first contact 1604 and the second contact 1606. The first path can be between two control contacts. The second path can be between an input contact and an output contact, such as between the third contact 1608 and the fourth contact 1610. The second path can be between two control contacts.

The at least one control element 1626 can be electrically coupled to the set of contacts. The at least one control element 1626 can be configured to selectively couple and/or uncouple a source to the set of contacts. For example, the at least one control element 1626 can be configured to switch between coupling the source to the set of contacts and uncoupling the source from the set of contacts. The source can comprise an electrical source (e.g., current voltage) and/or other source. A first coupling (e.g., a first time selectively coupling, or a first coupling event) of the source to the set of contacts can cause the first path to become more conductive than the second path. A second coupling (e.g., a second time selectively coupling) of the source to the set of contacts can cause the first path to become more conductive than the second path. For example, the second coupling can occur next in time after uncoupling the first coupling.

In an aspect, coupling the at least one control element 1626 to the set of contacts can modify a state of the first path and/or second path. Uncoupling the at least one control element 1626 from the set of contacts can modify a state of the first path and/o second path. For example, uncoupling the first coupling (e.g., changing from coupling a first time being uncoupled) of the source to the set of contacts can modify the first path to become more resistive than the second path. Modifying the first path can comprise forming an amorphous region in the reconfigurable layer (e.g., medium) within the first path. For example, uncoupling the second coupling (e.g., changing from coupling a second time to being uncoupled) of the source to the set of contacts can modify the second path to become more resistive than the second path. Modifying the second path can comprise forming an amorphous region in the reconfigurable layer (e.g., medium) within the second path. Coupling the at least one control element 1626 to the set of contacts can cause the source to be channeled through the first path and/or second path. Channeling of the source through the first path during the first coupling (e.g., first coupling event) can liquefy a region within the first path and/or recrystallize an amorphous region with the second path. Channeling of the source through the second path during the second coupling (e.g., second coupling event) can liquefy a region (e.g., form a filament) within the first path and/or recrystallize an amorphous region within the first path.

The reconfigurable device 1600 can be configured with a variety of geometries and contact placement. For example, the first path can be located close enough to the second path such that channeling of the source through the second path during a coupling event (e.g., second coupling event) modifies a state (e.g., conductivity, resistivity, throughput) of the first path. The second path can be located close enough to the first path such that channeling of the source through the first path while the device 1600 is coupled (e.g., during a first coupling event) modifies a state (e.g., conductivity, resistivity, throughput) of the first path. A first distance between the first side 1620 and the second side 1622 where the first path is located can be shorter than a second distance between the first side 1620 and the second side 1622 where the second path is located. For example, the first path can be shorter than the second path.

FIG. 17 is a flowchart illustrating an example method for controlling a signal. At step 1702, a first state can be formed in a reconfigurable layer. For example, the first state can be formed by applying a first control signal (e.g., one or more signals) to one or more of a set of contacts (e.g., terminals, electrodes). In an aspect, the first control signal can modify a first portion of the reconfigurable layer thereby isolating the first contact from the second contact, the third contact, and/or other contacts. The first control signal can be configured to isolate the first contact from the second contact by forming a first amorphous region (e.g., region of amorphous phase change material) within the reconfigurable layer. For example, the first amorphous region can be formed as a path, line, barrier, and/or the like between at least two of the contacts of the set of contacts. The first amorphous region can comprise a plug, bulge, and/or the like formed at (e.g., around, extending from) an end of a contact (e.g., as shown in FIG. 10).

In an aspect, the reconfigurable layer can be a structure, such as a three-dimensional structure. For example, the reconfigurable layer can be formed as a tube (e.g., a pipe). The reconfigurable layer can be a substantially two-dimensional structure. For example, the reconfigurable layer can comprise a planar structure, a thin film, and/or the like. The phase change material can comprise a chalcogenide alloy.

In an aspect, the set of contacts can be electrically connected (e.g., coupled) and/or otherwise attached (e.g., connected) to the reconfigurable layer. For example, an edge of one or more (or each) of the contacts of the set of contacts can be in contact with an edge of the reconfigurable layer. In an aspect, the set of contacts can comprise at least a first contact, a second contact, and a third contact. As a further example, the set of contacts can comprise 4 contacts, 6 contacts, 7 contacts, 8 contacts, and/or other number as illustrated throughout the present disclosure. The first contact can be an input contact, an output contact, and/or a control contact (e.g., contact configured to write and erase amorphous regions). The second contact can be an input contact, an output contact, and/or a control contact. The third contact can be an input contact, an output contact, and/or a control contact.

In an aspect, the first contact (e.g., $I_1$, $I_2$) can be positioned directly across or diagonally across the reconfigurable layer from the second contact (e.g., $O_1$, $O_2$). The first contact and the third contact (e.g., $I_1$, $I_2$) can be located on a first side (e.g. top) of the reconfigurable layer. The second contact can be located on a second side (e.g., bottom) of the reconfigurable layer. The first side can be opposite from the second side. For example, the first side can comprise a top of the tube. The second side can comprise a bottom of the tube.

In an aspect, the set of contacts can comprise a first control contact (e.g., $W_1$, $W_2$) and a second control contact (e.g., $W_3$, $W_4$). For example, the first control signal can be configured a form the first amorphous region in the reconfigurable layer along a pathway between the first control contact and the second control contact. For example, the first amorphous region can be formed along a line, path, or barrier from the one contact to another contact. The region can isolate an input contact (e.g., first contact, third contact) from one or more output contacts. The first amorphous region can isolate an output contact (e.g., second contact, fourth contact) from one or more input contacts. The first amorphous region can extend between an input contact and an output contact (e.g., as shown in FIG. 12A, FIG. 12B, and FIG. 13).

In an aspect, the set of contacts can comprise a fourth contact. The first control signal can be configured to form a crystalline path between the first contact and the fourth contact. The crystalline path can be at least partially encased in an amorphous region (e.g., first amorphous region) configured to isolate the crystalline path from the second contact and the third contact.

At step 1704, a first output (e.g., first data output) can be received from the reconfigurable layer based on the first state of the reconfigurable layer. For example, a first signal can be provided to one or more of the set of contacts. The signal can be transmitted across the reconfigurable layer based on the first state. For example, the first state can select, divert, isolate, block, and/or the like one or more outputs (e.g., second contact, fourth contact) from receiving the first signal.

At step 1706, the reconfigurable layer can be switched (e.g., modified) to a second state. For example, the reconfigurable layer can be modified by applying a second control signal (e.g., one or more signals) to one or more of the set of contacts electrically connected to the reconfigurable layer. The second control signal can change which of the set of contacts are isolated or not isolated. For example, the second control signal can be configured to isolate the third contact from the second contact. As another example, the second control signal can be configured to isolate the fourth contact from one or more of the first contact and the third contact. The fourth contact can be located on the second side of the reconfigurable layer.

In an aspect, the second control signal can be configured to form a second amorphous region. The second amorphous region can be formed along a path, line, and/or the like between two of the contacts of the set of contacts (e.g., a third control contact, fourth control contact). The second control signal can be configured to remove at least a portion of the first amorphous region formed in step 1702 (e.g., causing the first contact to no longer be isolated from the second contact). For example, the second control signal can cause the first amorphous region to recrystallize.

At step 1708, a second data output can be received from the reconfigurable layer based on the second state. For example, a second signal (e.g., which may be the same as the first signal) can be provided to one or more of the set of contacts. The second signal can be transmitted across the reconfigurable layer based on the second state. For example, the second state can select, divert, isolate, block, and/or the like one or more outputs (e.g., second contact, fourth contact) from receiving the second signal.

FIG. 18 is a flowchart illustrating an example method for reconfiguring a device. At step 1802, a first portion of a phase change structure between a first contact and a second contact can be melted. The first contact (e.g., terminal, electrode) can be connected (e.g., attached, electrically coupled) to the phase change structure. The first contact (e.g., terminal, electrode) can be connected (e.g., attached, electrically coupled) to the phase change structure. For example, melting the first portion can comprise applying a first voltage between the first contact and the second contact, At step 1804, an amorphous region can be formed around the first portion. For example, a second voltage can be applied between the first contact and second contact. As another example, forming the amorphous region can comprise reducing the first voltage to a second voltage. The second voltage can be smaller than the first voltage. As an illustration, the first voltage can be approximately 1V, and the second be approximately 0.2 V. In an aspect, a filament (e.g., liquid portion) can be retained within the amorphous region (e.g., until later crystallization).

At step 1806, the first portion can be crystallized thereby forming a conductive path from the first contact to the second contact. Crystallizing the first portion can comprise forming the conductive path via nucleation and growth. For example, growth can occur based on a solid (e.g., amorphous, crystalline) portion proximate the first portion. In an aspect, the conductive path can be isolated, by the amorphous region, from a third contact connected to the phase change structure.

At step 1808, a first signal can be provided through the conductive path. For example, the first signal can comprise a data signal. The first signal can be channeled to the second contact based on the first signal. In an aspect, a second signal can be provided through the phase change structure between the third contact and a fourth contact connected to the phase change structure.

Figure 19:
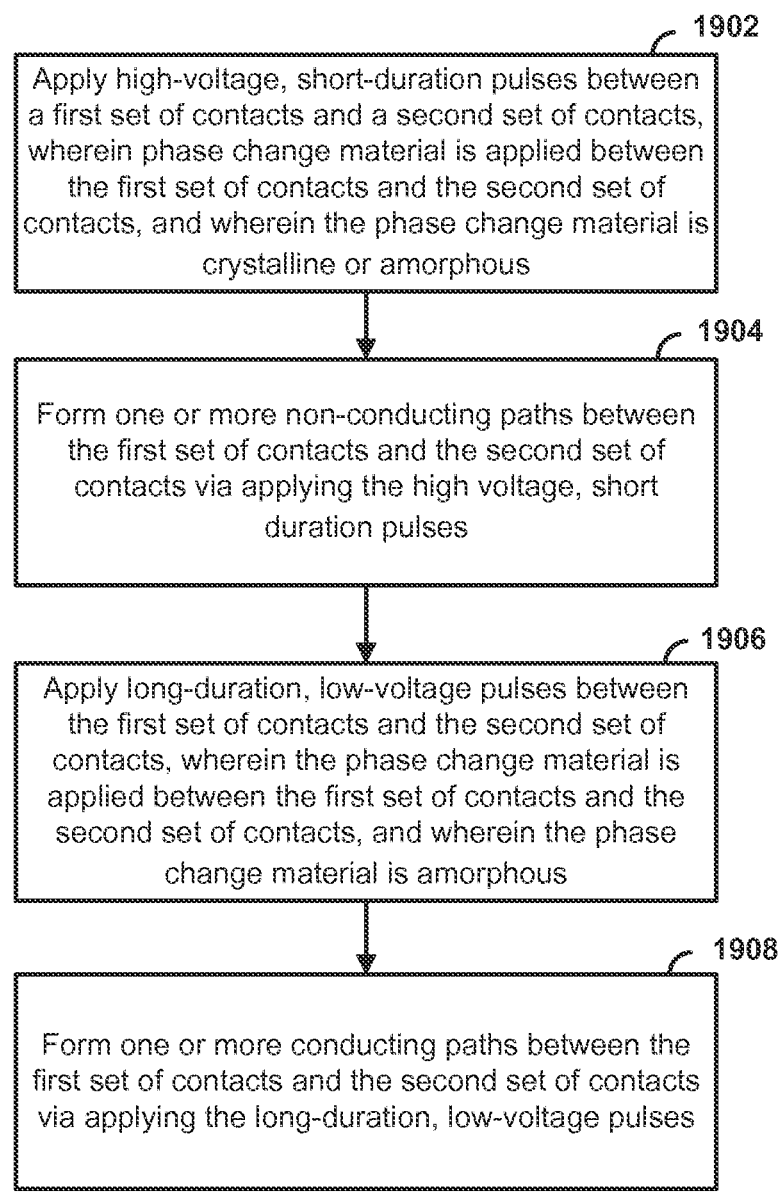
FIG. 19 is a flow chart illustrating another exemplary method for operating a reconfigurable device.
Figure 20:
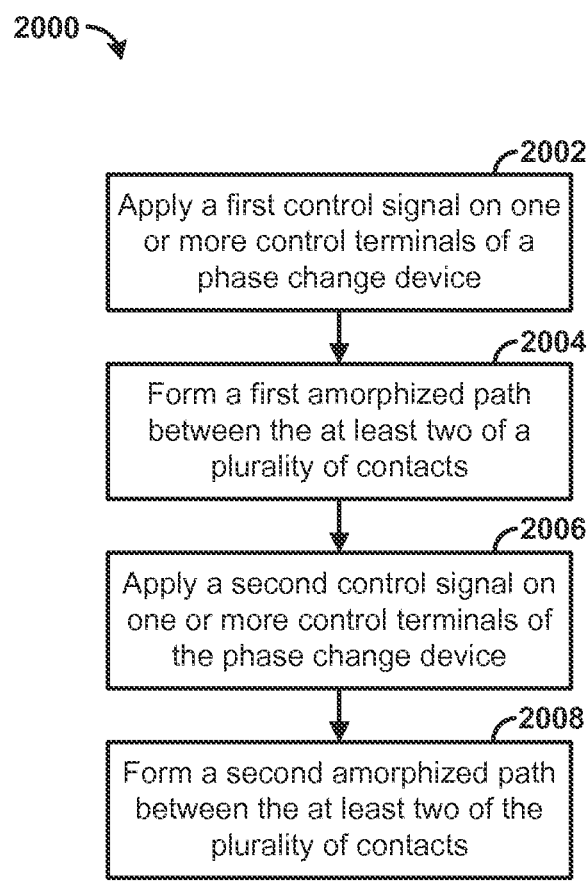
FIG. 20 is a flowchart illustrating another exemplary method for operating a reconfigurable device.

FIG. 19 is a flow chart illustrating an example method for using a phase change device. At step 1902, high-voltage, short-duration pulses can be applied between a first set of contacts and a second set of contacts. As an illustration, a voltage on the order of 1 Volt (e.g., 1, 2, 3 V or other voltage) can be applied for a time the order of 100 picoseconds (e.g., 100, 200 ps). The phase change material can be applied between the first set of contacts and the second set of contacts. The phase change material can be crystalline or amorphous. At step 1904, one or more non-conducting paths can be formed between the first set of contacts and the second set of contacts via applying the high voltage, short duration pulses. At step 1906, long-duration (e.g., on the order of a micro second), low-voltage pulses (e.g., on the order of 0.1 V) can be applied between the first set of contacts and the second set of contacts. The low voltage pulses can be lower in voltage than the high voltage pulses. The phase change material can be applied between the first set of contacts and the second set of contacts. For example, the phase change material can be amorphous. At step 1908, one or more conducting paths can be formed between the first set of contacts and the second set of contacts via applying the long-duration, low-voltage pulse. As an example, the phase change material can be a chalcogenide alloy. In an aspect, a plurality of transistors can be electrically coupled to the first and second sets of contacts FIG. 20 is a flowchart illustrating an example method. At step 2002, a first control signal can be applied on a control contact (e.g., terminal, electrode) of a reconfigurable device, such as a phase change device. In an aspect, the first signal can be a clock controlled signal. In an aspect, the disclosed reconfigurable phase change device can comprise a two dimensional structure (e.g. a tube structure, a planar structure). The two dimensional structure can comprise phase change material. A plurality of contacts can be attached to the two dimensional structure. The plurality of contacts can comprise one or more control contacts, two or more input contracts, one or more output contacts, and/or the like. A plurality of control signals can be applied on one or more control contacts such that one input terminal is isolated from the one or more output contacts at a time. In an aspect, the reconfigurable device can comprise a three dimensional structure (e.g., a block) and a plurality of contacts attached to the three dimensional structure. The three dimensional structure can comprise phase change material. The plurality of contacts can comprise one or more control contacts, two or more input contacts, and one or more output contacts. A plurality of control signals can be applied on one or more control contacts such that an input contact can be isolated from one or more output contacts at a time. The reconfigurable device can be configured as a toggle device, a flip-flop device, a signal multiplexer, a memory device, and/or the like.

At step 2004, a first amorphized path can be formed between at least two of plurality of contacts. The first amorphized path can be formed by rapidly cooling a molten volume. The first amorphous path can isolate one input (e.g., a first input) contacts from output contacts, and other input contacts can remain connected by the crystalline phase change material.

At step 2006, a second control signal can be applied on the control contact. In an aspect, the second control signal can be a clock controlled signal. By sending the second control pulse, a current can flow between intact control contacts as it has a more conductive current path. In an aspect, step 2006 can comprise crystallizing the first amorphous path by utilization of thermal cross talk (e.g., heat generated from step 2006 can be close enough to the first amorphized path to crystallize the first amorphized path).

At step 2008, a second amorphized path can be formed between the at least two of the plurality of contacts. At least one of the plurality of contacts associated with the second amorphized path can be different from at least one of the plurality of contact associated with the first amorphized path. The first amorphized path can recrystallize. The second amorphous path can isolate another input (e.g., a second input) contact from output contacts. The process can be repeated every time a control signal is sent, leading to toggling the inputs.

In an aspect, the disclosed reconfigurable device can be configured for thermal runaway utilization for electrical current path selection. For example, two paths (e.g., loads), a first path and a second path, can be connected to the same source point. Due to device geometry or fabrication variations the first path may lose resistance faster than the second path. As the resistance of the first path decays (e.g., decreases), the first path can drag (e.g., channel) more current and can lose even more resistance falling in a positive feedback situation. Utilizing this positive feedback phenomenon to selectively flow current between two parallel paths is an aspect of the present disclosure.

In an aspect, the disclosed reconfigurable device can be configured for thermal cross talk. Forming contacts (e.g., on the same edge of a reconfigurable layer) close to each other such that the heat generated due to the operation at one contact will affect the active region at the other contact can lead to phase transition. Thermal cross talk is usually addressed as a problem that affects electronic device operation the reconfigurable device utilizing uses thermal cross talk to achieve logic operation.

In an aspect, the reconfigurable device can be formed in a geometry that allows isolation between certain inputs and the output and utilizing the thermal cross talk. For example, the reconfigurable device can comprise a multi-contact patch in the form a trapezoid, square, a disk, and/or the like With a slight modification on the device geometry example reconfigurable devices were found to achieve much broader functionality based on the way the reconfigurable device's terminals were connected, the number of reconfigurable devices used, and/or the like.

In an aspect, an example reconfigurable device can be configured as an n=0 undeterministic device. For example, the reconfigurable device can comprise one device with the two control terminals that may be shorted. The reconfigurable device can be configured as a Toggle Multiplexer and flip-flop.

Figure 21A:
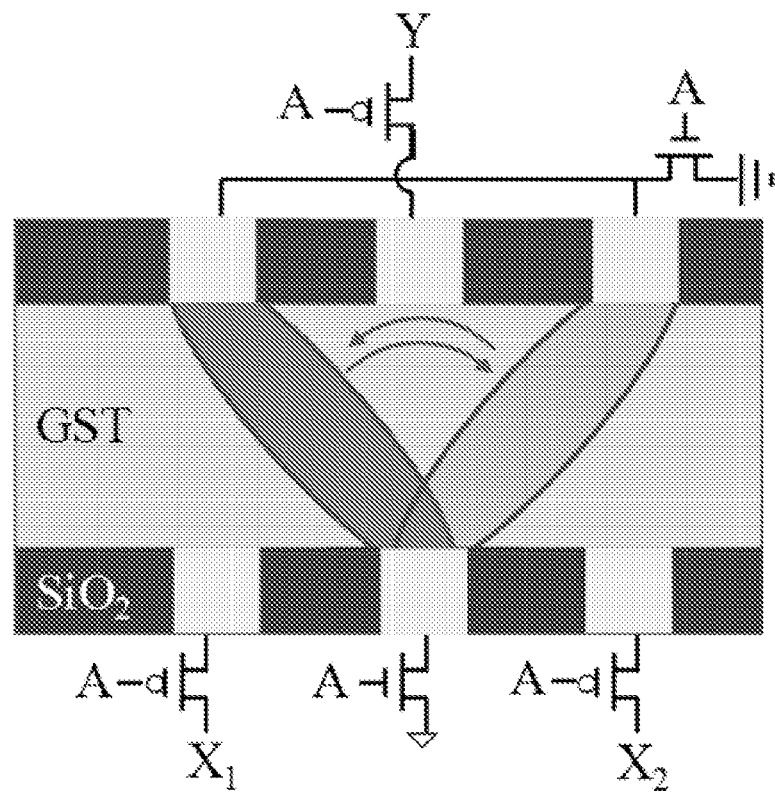
FIG. 21A is a schematic showing an example reconfigurable device.
Figure 21B:
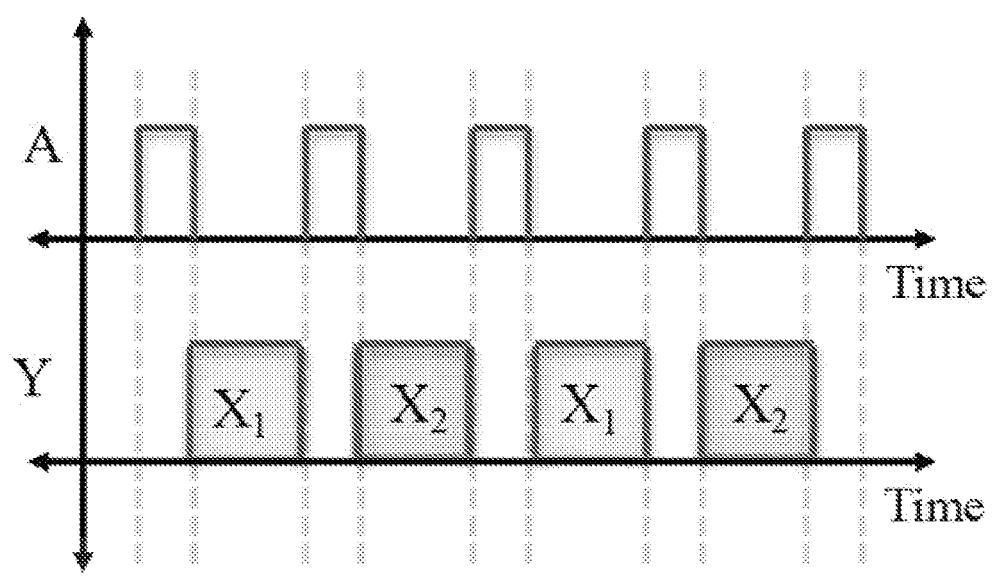
FIG. 21B illustrates the relationship between an input signal (A) and the output signal (Y)
Figure 21C:
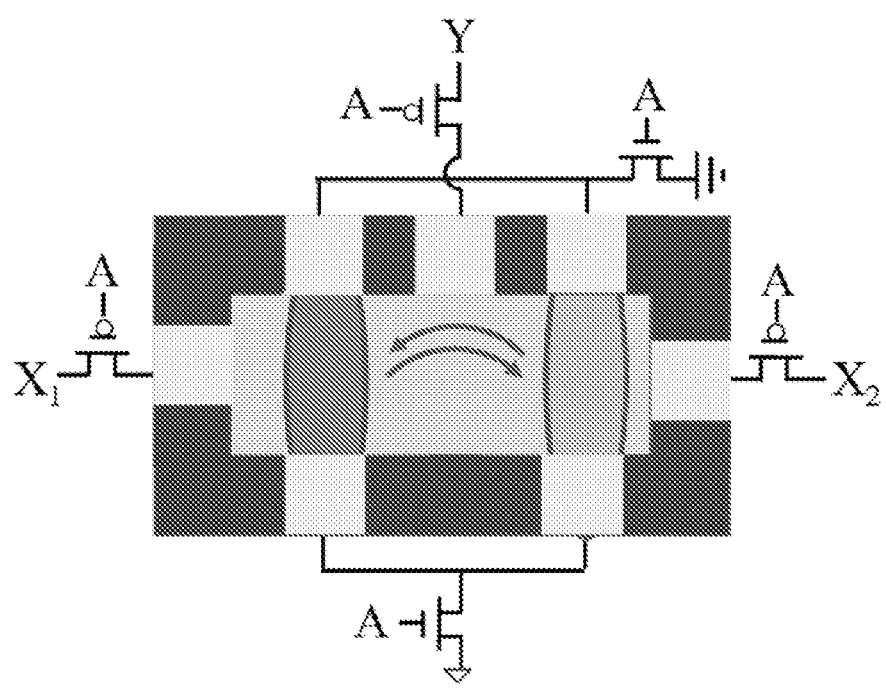
FIG. 21C illustrates an alternative configuration of the reconfigurable device.

FIG. 21A is a schematic showing an example reconfigurable device. The amorphous paths and how the amorphous path toggle after sending the same control pulse are shown. FIG. 21B illustrates the relationship between an input signal (A) and the output signal (Y). The same input can result in toggling the output between X1 and X2. FIG. 21C illustrates an alternative configuration of the reconfigurable device in which the amorphous paths are to be formed between two distinct contacts instead of having a shared contact.

These device configurations (e.g., shapes) may result in an un-deterministic first time operation. Then the reconfigurable device can toggle (e.g., switch) between the two states. This randomness could be useful in security applications and random number generation.

In an aspect, an example reconfigurable device can be configured as an n=0 deterministic device. By adjusting the geometry of the reconfigurable device to have a trapezoid or a triangle, the input connected to closer to the longer edge (e.g., X1 in this case) will have the highest priority and will always be chosen when the device is initialized.

Figure 22A:
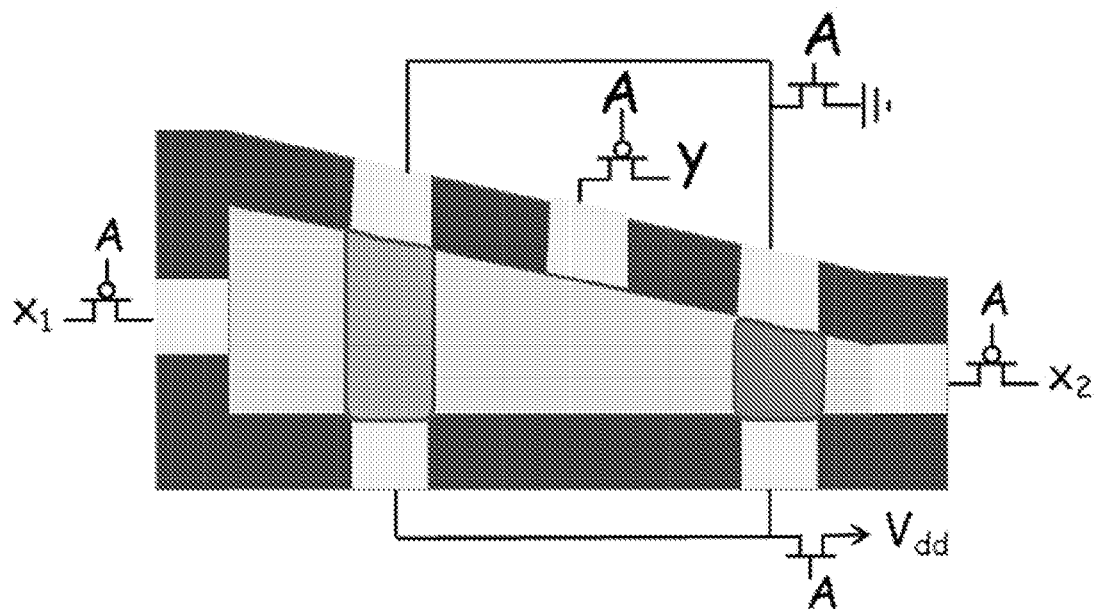
FIG. 22A illustrates an example reconfigurable device configured as a deterministic device variant.
Figure 22B:
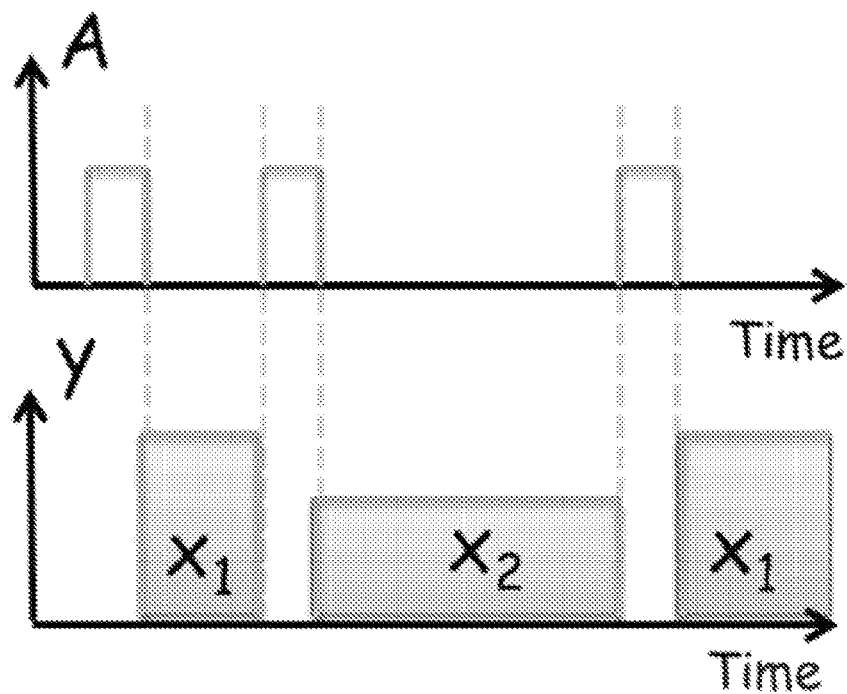
FIG. 22B shows the relationship between the input signal A and the output signal Y.

FIG. 22A illustrates an example reconfigurable device configured as a deterministic device variant. In the case shown in the FIG. 22A, output X1 will always be connected to the output terminal after pulsing the initial all crystalline state. FIG. 22B shows the relationship between the input signal A and the output signal Y.

Figure 23:
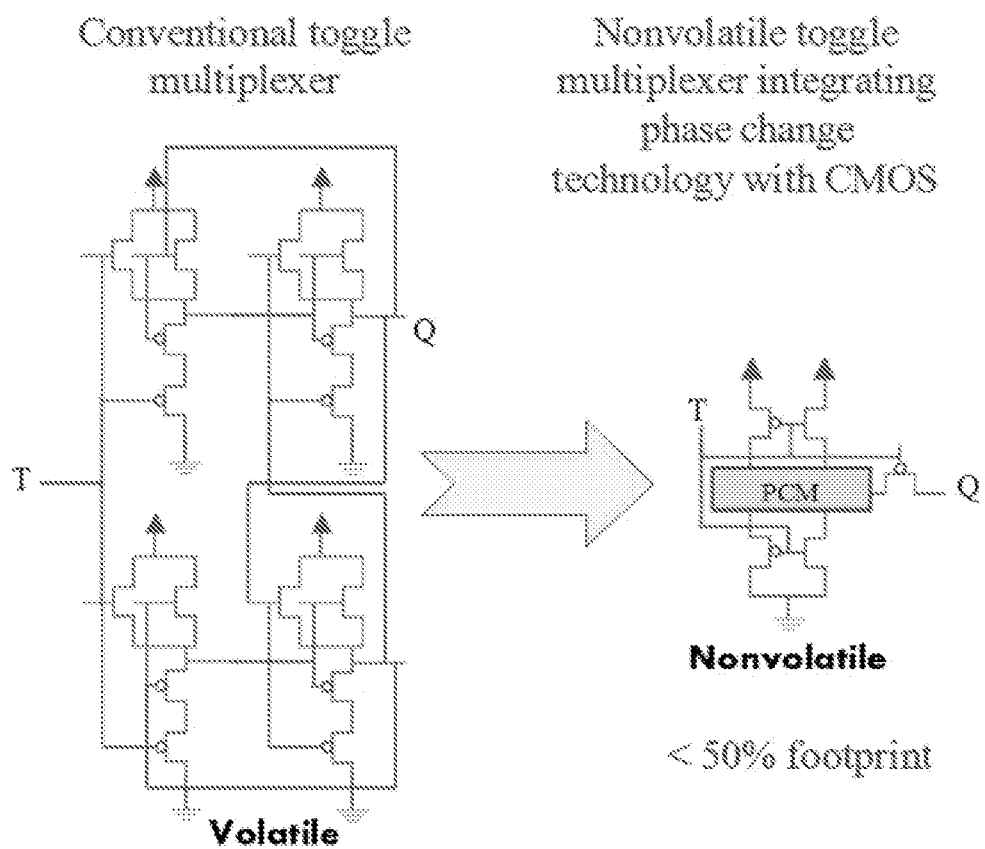
FIG. 23 illustrates the size comparison of a typical toggle multiplexer to a reconfigurable device configured as a toggle multiplexer.

In the n=0 configuration, 50% reduction in the footprint can be obtained over other devices with the added feature of non-volatility. FIG. 23 illustrates the size comparison of a typical toggle multiplexer to a reconfigurable device configured as a toggle multiplexer.

Figure 24:
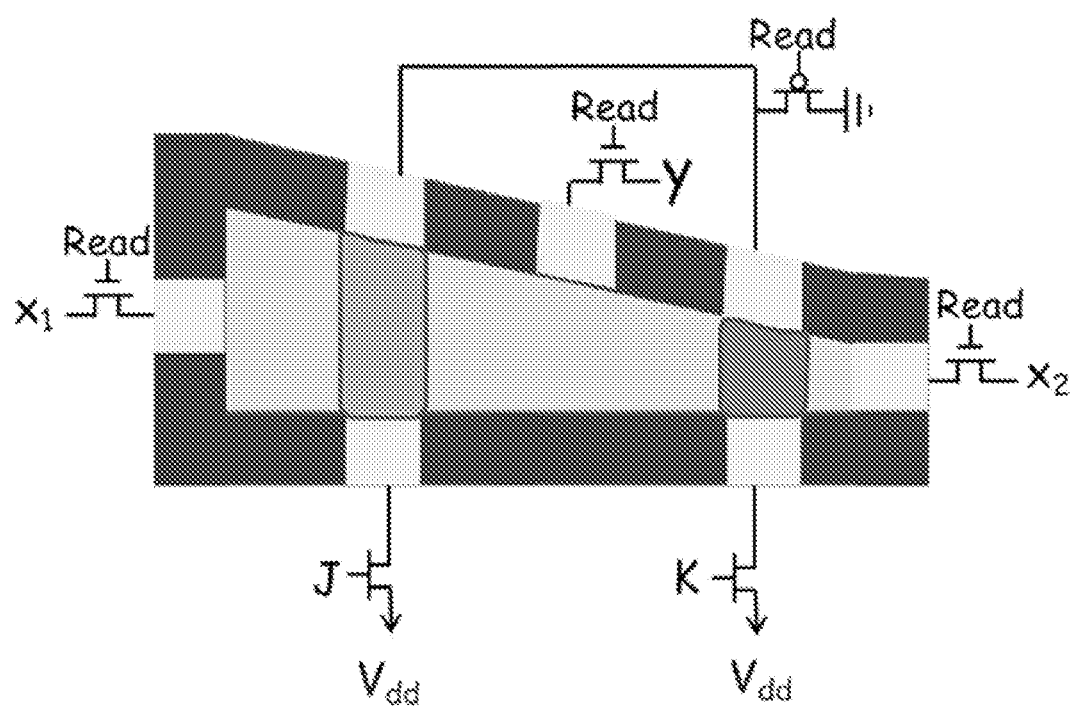
FIG. 24 illustrates another example reconfigurable device.

FIG. 24 illustrates another example reconfigurable device. The example reconfigurable device can be configured as an n=1 device (e.g., one device with the two control terminals or paths that are not shorted). For example, the reconfigurable device can be compared to a CMOS counterpart (JK flip-flop). When the two control terminals of the reconfigurable device are controlled independently, the reconfigurable device can operate like a JK flip-flop. The conventional CMOS JK-flip-flop requires 18 transistors while the reconfigurable device (e.g., PCM-JK) in this case may utilize only 6 transistors which is about 66% savings in footprint with the added feature of non-volatility.

In an aspect, an example reconfigurable device can be configured as an n≥2 device (e.g., sequential n bit state machine). Connecting more than one reconfigurable device in series in a way that the reconfigurable devices share common control signals can result in sequential state machine operation with $2^n$ states. State machines have a wide space of applications and are usually achieved by flip-flops. The example reconfigurable device achieves the state machine operation with less number of transistors and smaller footprint. Plus, the state machines obtained by the reconfigurable device are non-volatile which makes the reconfigurable devices well suited for low and extremely low power operations.

Figure 25:
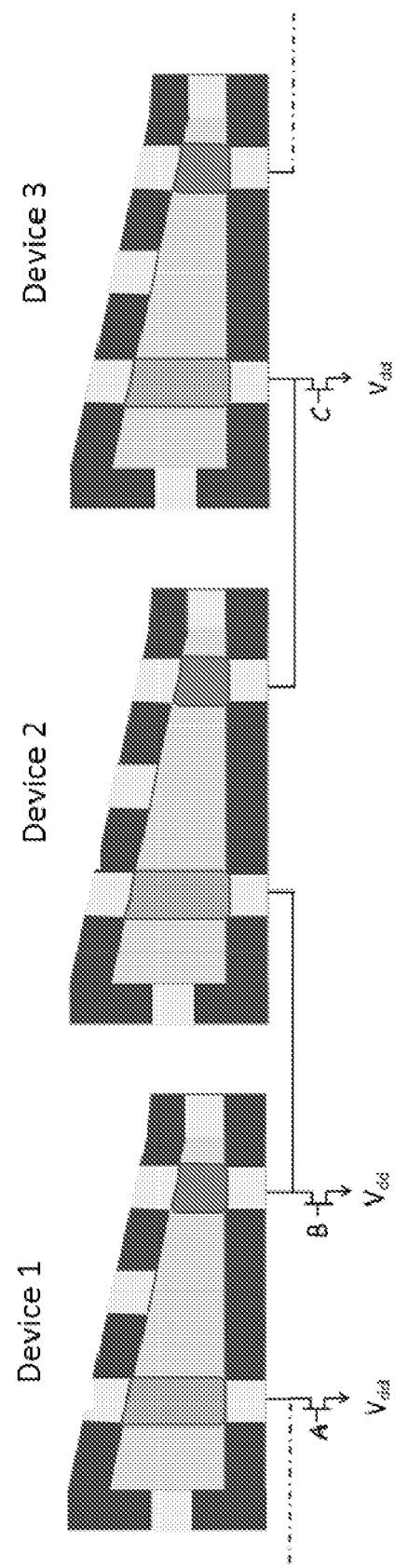
FIG. 25 illustrates another example reconfigurable device.

FIG. 25 illustrates another example reconfigurable device. For example, the reconfigurable device can be configured as an n=3 device, such as a three bit state machine achieved by connecting three reconfigurable devices in series with each other. The input and output transistors can be removed to avoid crowdedness and may be configured similar to what is shown in FIG. 25. One or more (or each, every) control transistor is connected to two terminals in two reconfigurable devices. Transistor B, for instance, can be connected to the short terminal of device 1 and the long terminal of device 2.

Figure 26B:
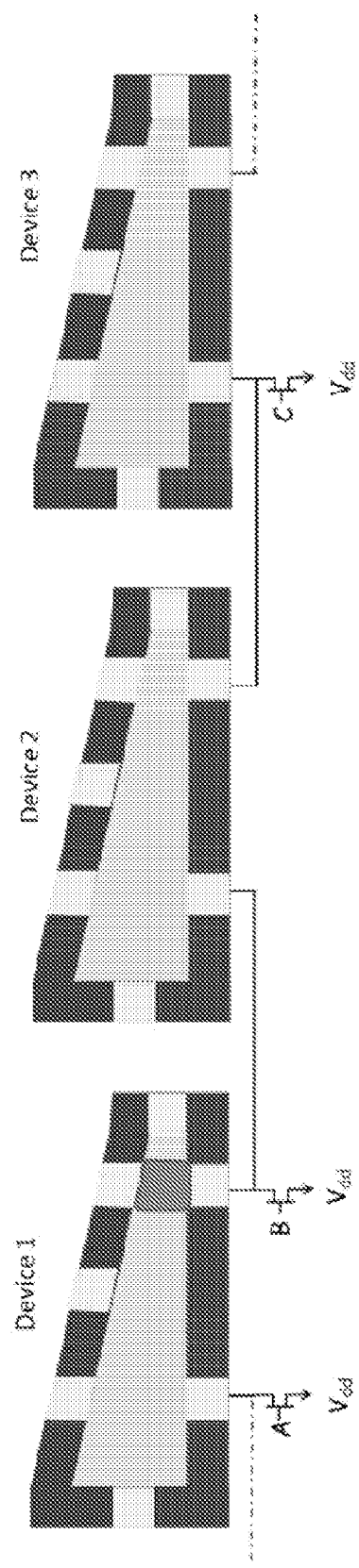
FIG. 26B illustrates sending one pulse to transistor B.
Figure 26C:
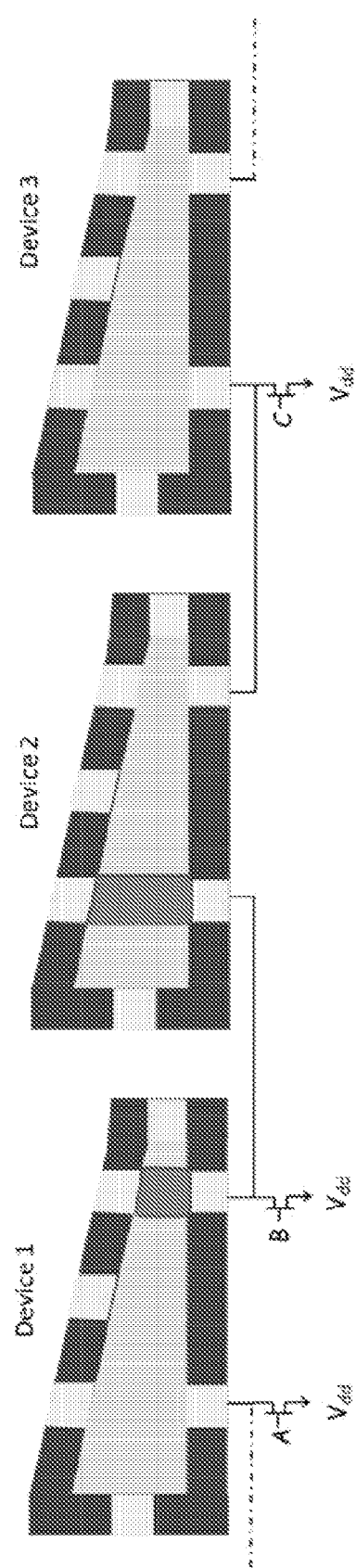
FIG. 26C illustrates sending another pulse to transistor B.
Figure 26D:
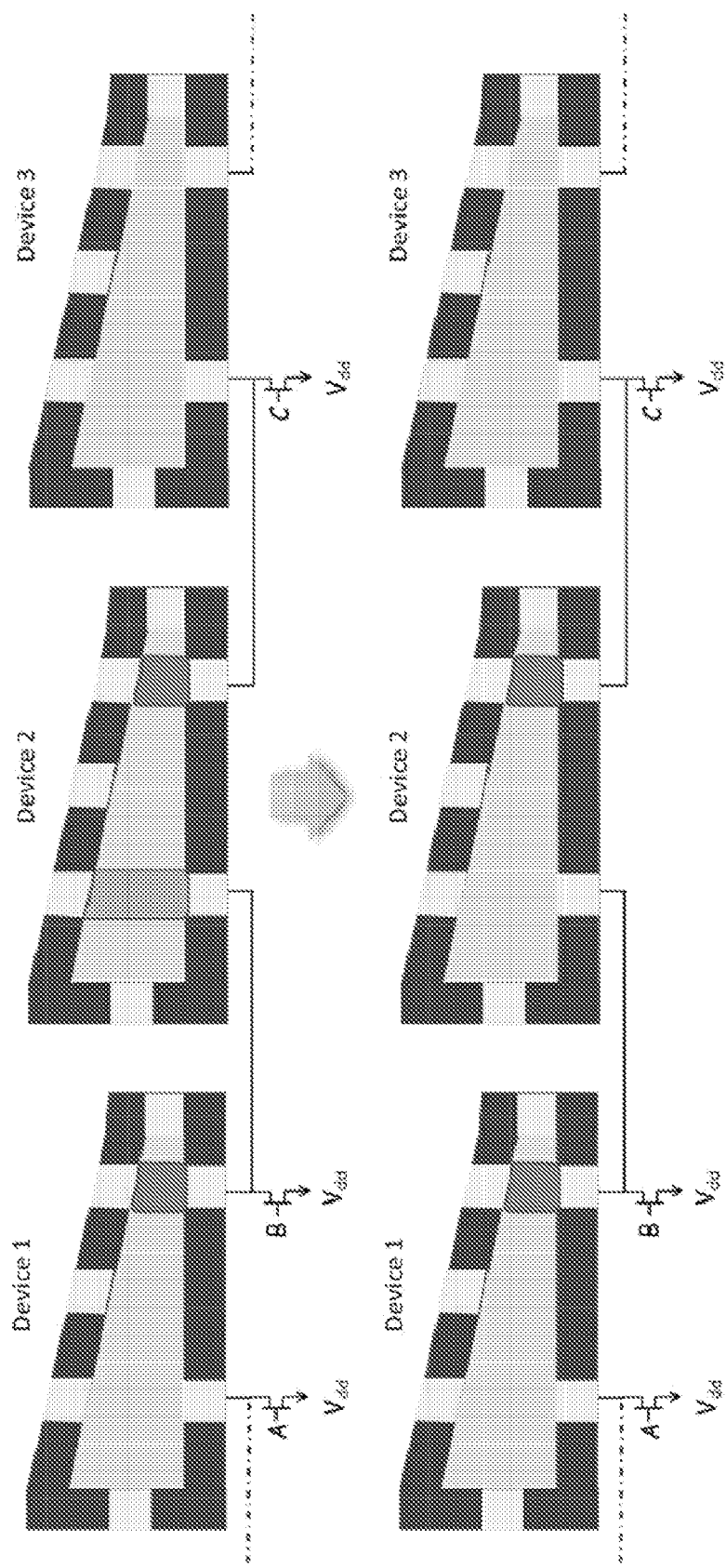
FIG. 26D illustrates sending another pulse to transistor C.
Figure 26E:
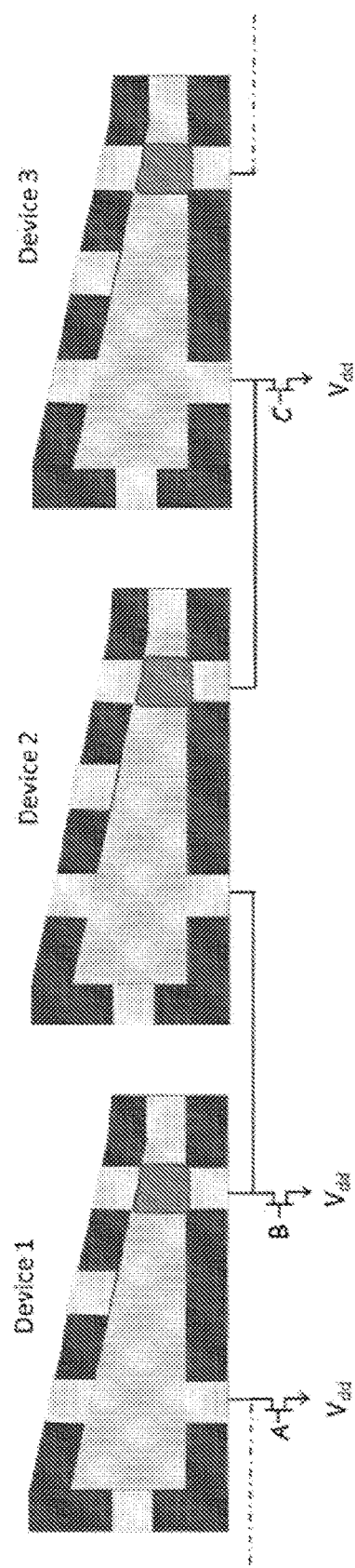
FIG. 26E illustrates sending a pulse to transistor A.
Figure 26F:
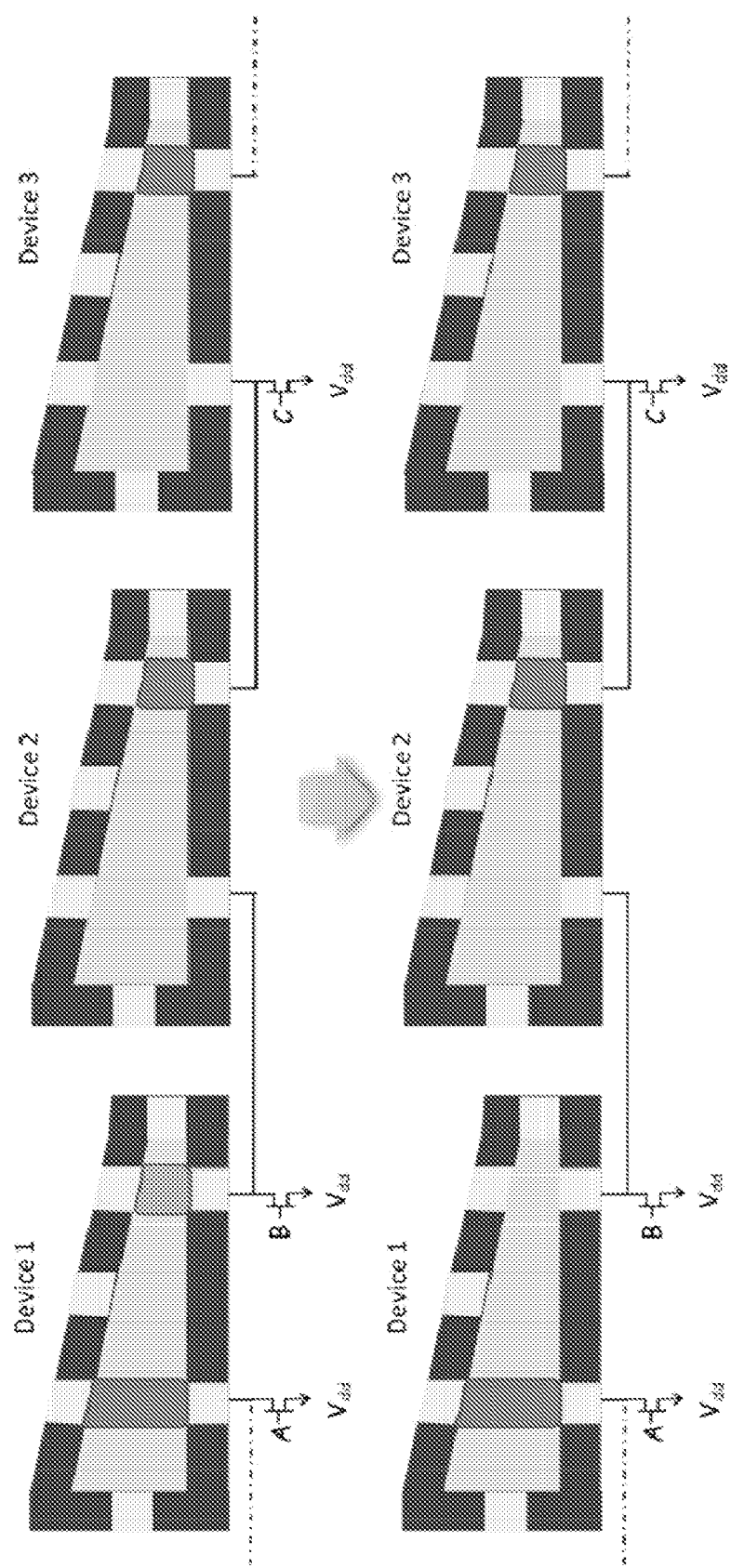
FIG. 26F illustrates sending another pulse to transistor A.
Figure 26G:
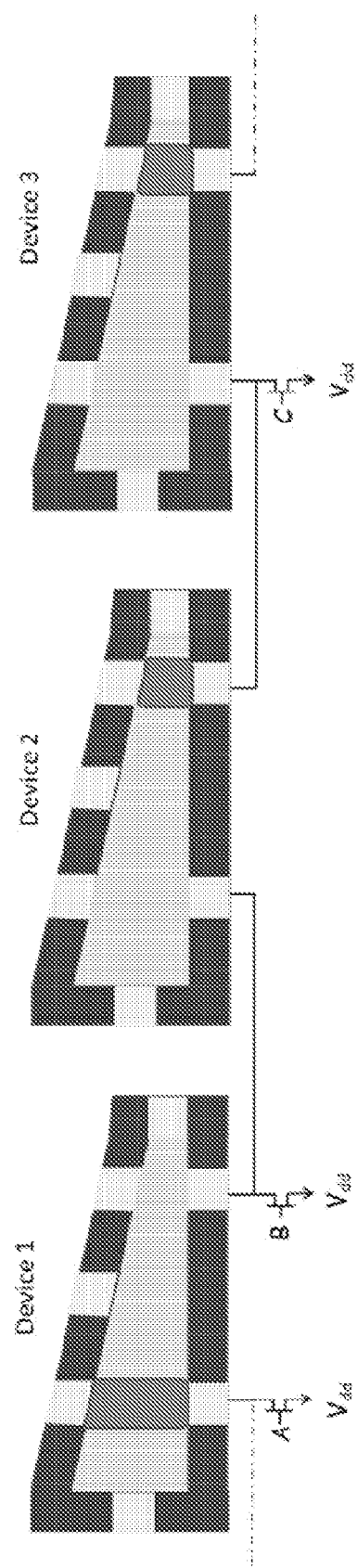
FIG. 26G illustrates sending another pulse to the transistor A.

FIG. 26A through FIG. 26G illustrate device operation for an example n=3 reconfigurable device. FIG. 26A illustrates an initial state (all crystalline) of the reconfigurable device. FIG. 26B illustrates sending one pulse to transistor B. The pulse can amorphize the shorter terminal of device 1. FIG. 26C illustrates sending another pulse to transistor B. The pulse can amorphize the longer terminal of device 2. Sending more pulses to the B transistor may not change anything after this state. FIG. 26D illustrates sending another pulse to transistor C. The shorter terminal device 2 can pass most of the current and get amorphized. As the shorter terminal of device 2 is phase transitioning, cross thermal talk can heat the previously amorphized strip and crystallize it. FIG. 26E illustrates sending a pulse to transistor A. The pulse can amorphize the shorter terminal of device 3. FIG. 26F illustrates sending another pulse to transistor A. The pulse can amorphize the longer terminal of device 1 and crystallize device 1's shorter terminal through thermal cross talk. FIG. 26G illustrates sending another pulse to the transistor A. The pulse will not change anything and the machine will stay at the same state.

Based on the sequence at which the transistors are controlled, different states can be achieved. Every state can have a unique input and output relationship. For instance, for the state shown in FIG. 26E, the inputs can be connected to the left of the devices. For example, input 1 of each device can be connected to the output terminal of the device to the left. Meanwhile, for the state shown in FIG. 26F, the output of device 1 is connected to the input terminal of device 2, and the output terminals of devices 2 and 3 are connected to input 1.

Figure 27:
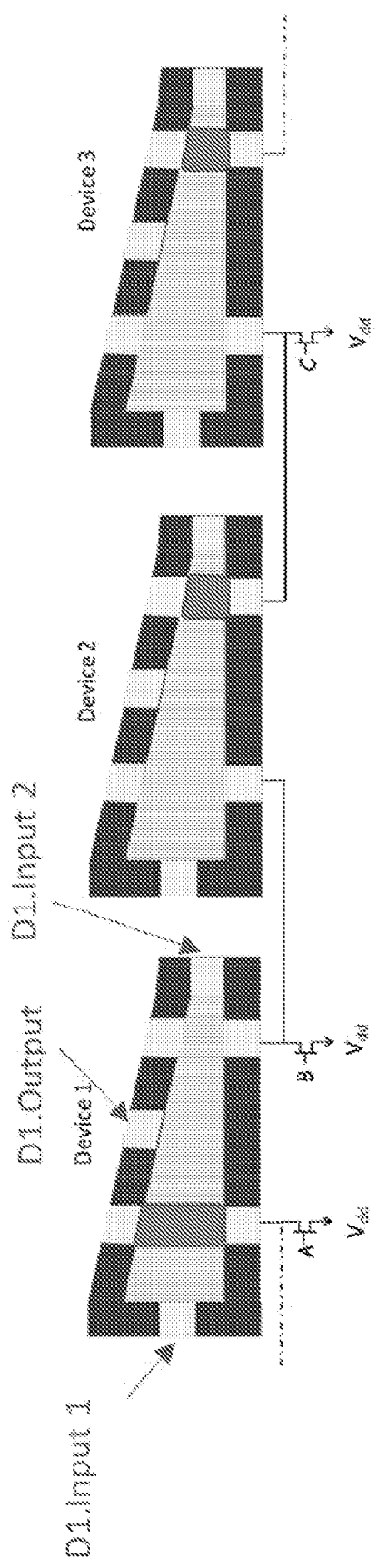
FIG. 27 illustrates an example reconfigurable device.

FIG. 27 illustrates an example reconfigurable device. Different states and operation can be achieved using different ways of device connection. For example, instead of having every control transistor connected to only two reconfigurable devices, a transistor can be connected to n reconfigurable devices. The reconfigurable devices may not be needed to form a ring (e.g., the last device connected to the first).

In an aspect, example operation principles for the reconfigurable device are described below. As mentioned earlier, the way that the reconfigurable devices are connected and operated the device geometry can determine operation of the reconfigurable device. To explain the basic operation principles; a simple reconfigurable device configuration is discussed (e.g., n=0). The device in FIG. 22 can be drawn with its electrical connections as shown below.

Figure 28:
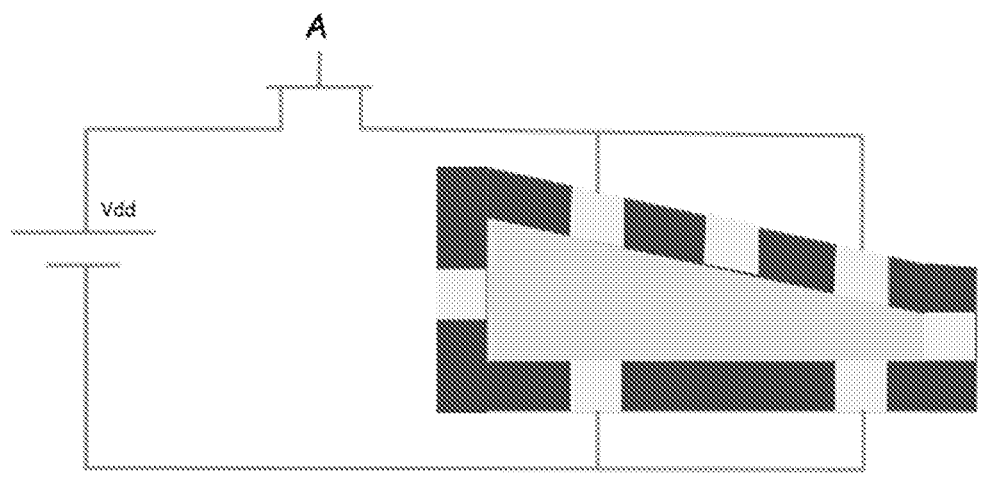
FIG. 28 illustrates a schematic of an example reconfigurable device.
Figure 29:
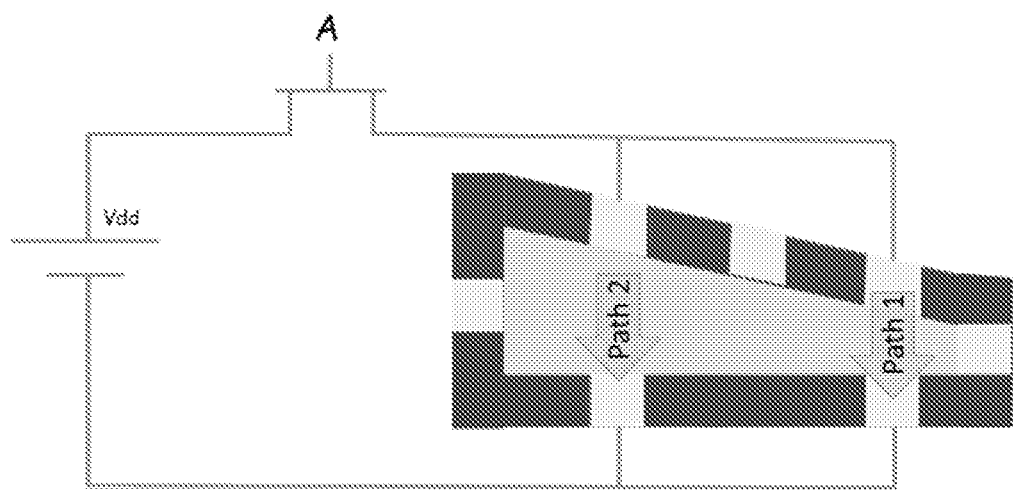
FIG. 29 illustrates another schematic of an example reconfigurable device.
Figure 30:
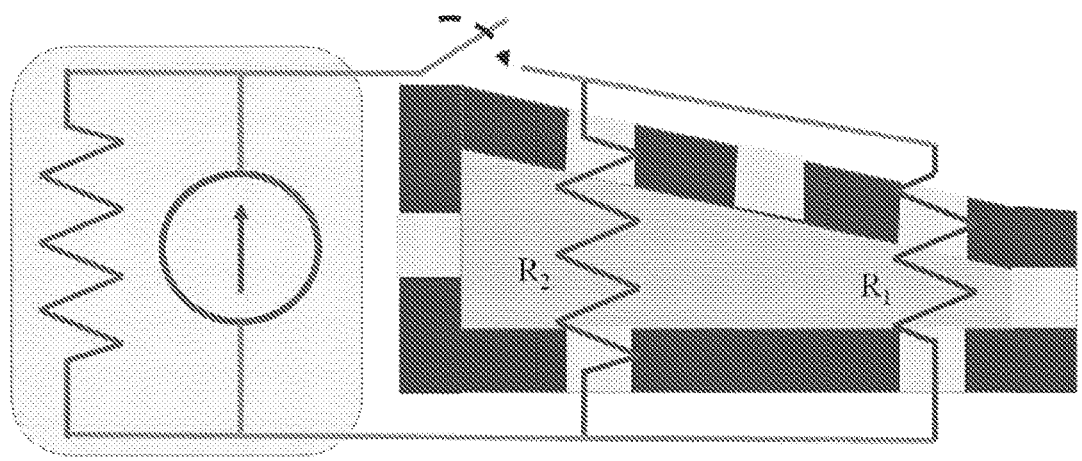
FIG. 30 illustrates another schematic of an example reconfigurable device.

FIG. 28 illustrates a schematic of an example reconfigurable device. When transistor A as activated, the current will have two significant paths. FIG. 29 illustrates another schematic of an example reconfigurable device. Due to the geometry the reconfigurable device, path 1 may have less resistance and attract more current that path 2. FIG. 30 illustrates another schematic of an example reconfigurable device. In this case $R_1 < R_2$ due to the geometric length difference. Furthermore, the resistance of R1 and R2 can be a function of temperature and decay exponentially as current flows in path 1 and path 2 due to joule heating and thermal runaway.

Figure 31A:
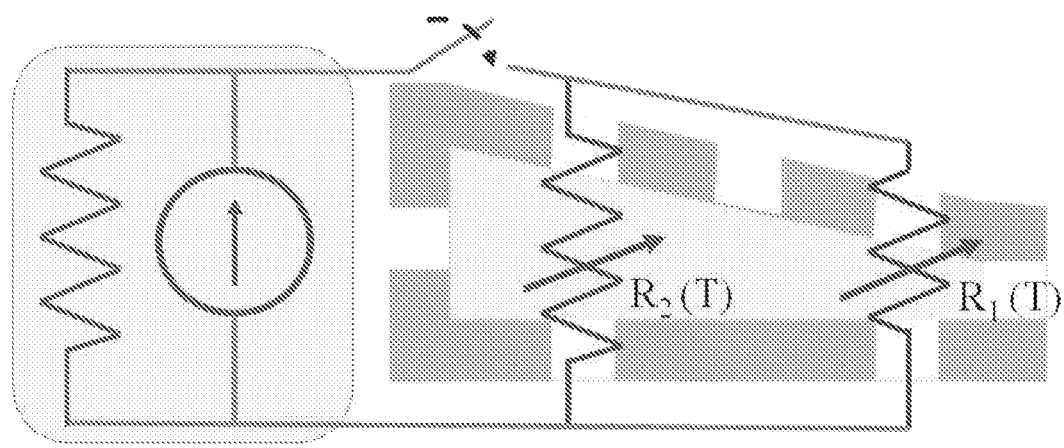
FIG. 31A illustrates another schematic of an example reconfigurable device.
Figure 31B:
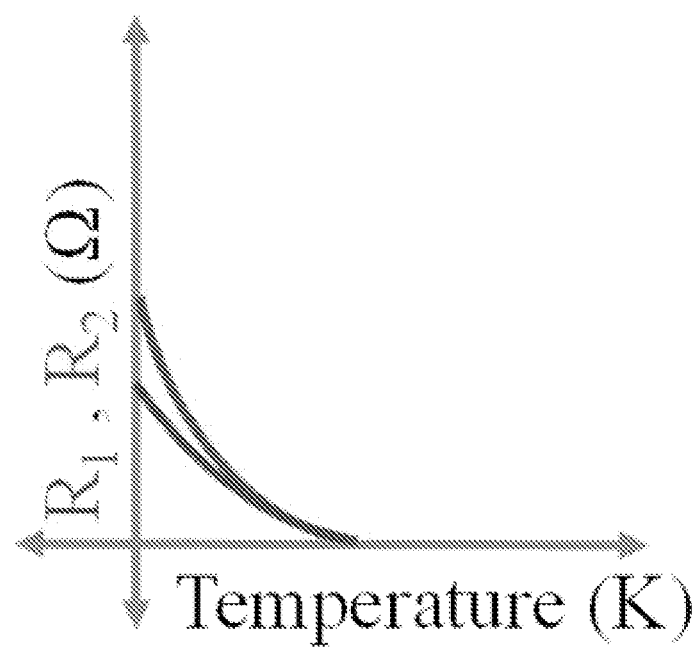
FIG. 31B is a graph illustrating the relationship of resistance and temperature of the device of FIG. 31A.

FIG. 31A illustrates another schematic of an example reconfigurable device. FIG. 31B is a graph illustrating the relationship of resistance and temperature of the device of FIG. 31A. When the switch is closed, more current can flow in R1 than in R2. This will result in heating R1 (e.g., path 1) more than R2 (e.g., path 2). Consequently, R1 resistance may drop even further and will attract even more current. This positive feedback may result in short-circuiting the R2 (e.g., depending on the minimum value that R1 will reach). In the context of phase change materials, there are about 2-4 orders of magnitude in resistance difference between an amorphous or crystalline phase and the molten liquid phase. Hence, very minimal current will flow in the other path (e.g., path 2).

When the switch is open again, the molten phase change material can rapid melt-quench resulting in a crystalline to amorphous phase transition. The amorphous phase has 2-4 orders of magnitude higher resistance compared with crystalline case.

Figure 32A:
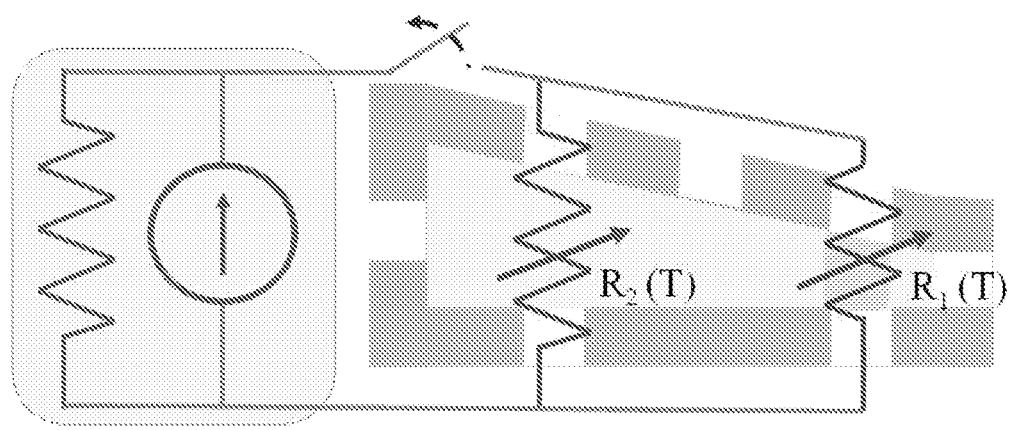
FIG. 32A illustrates another schematic of an example reconfigurable device.
Figure 32B:
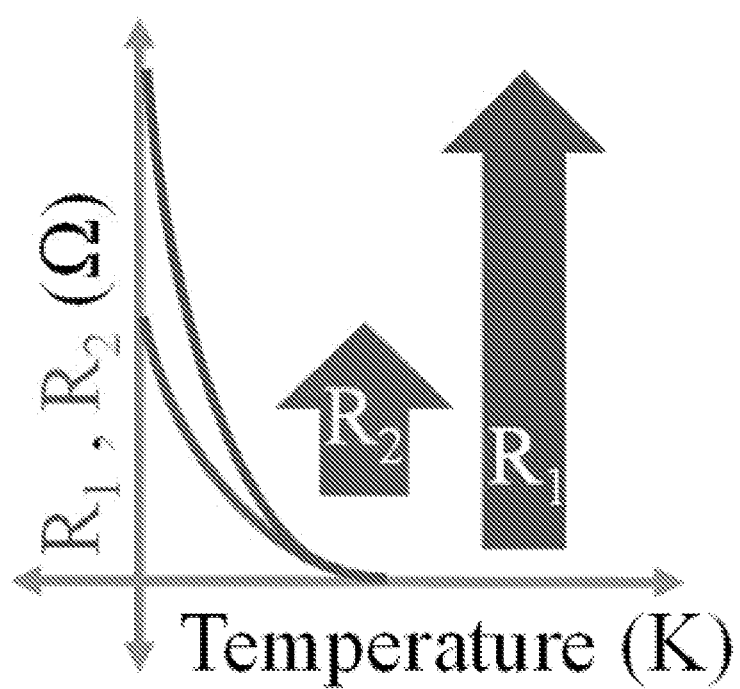
FIG. 32B is a graph illustrating the relationship of resistance and temperature of the device of FIG. 32A.
Figure 33A:
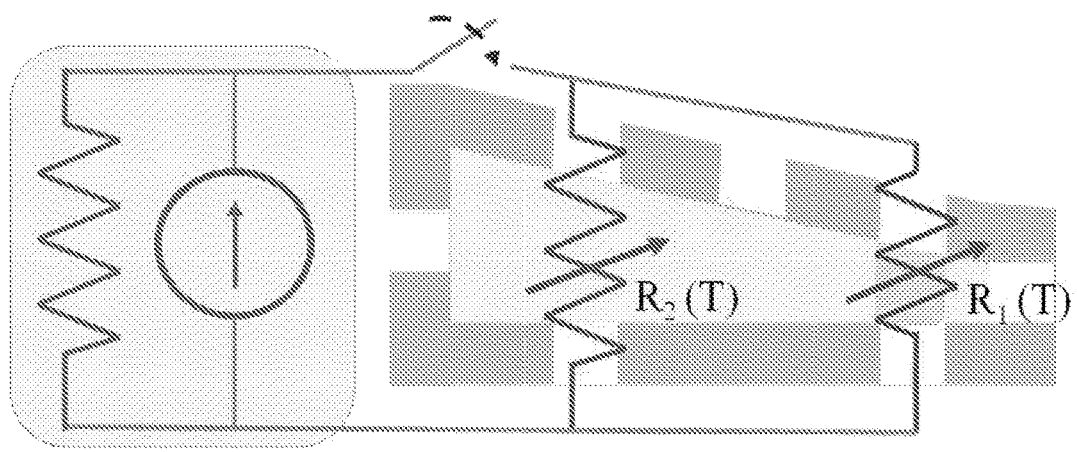
FIG. 33A illustrates another schematic of an example reconfigurable device.
Figure 33B:
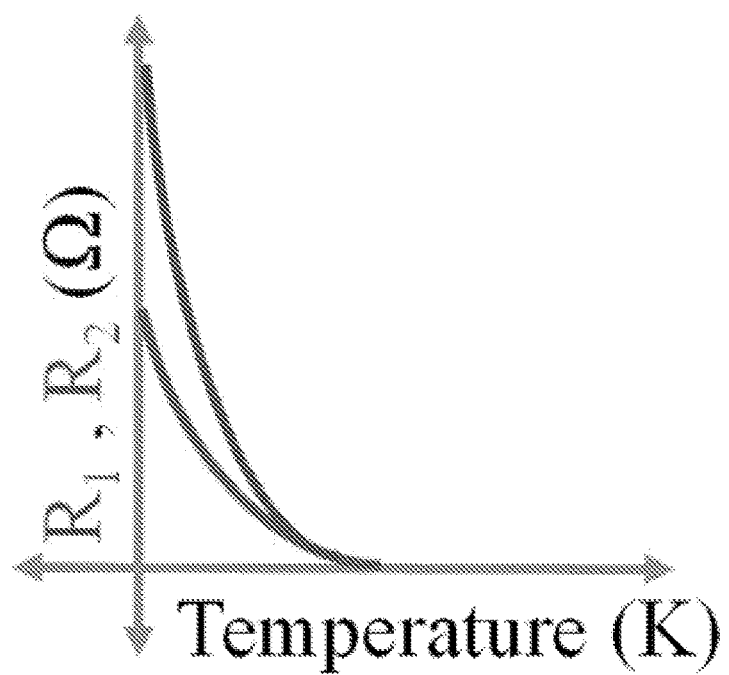
FIG. 33B is a graph illustrating the relationship of resistance and temperature of the device of FIG. 33A.
Figure 34A:
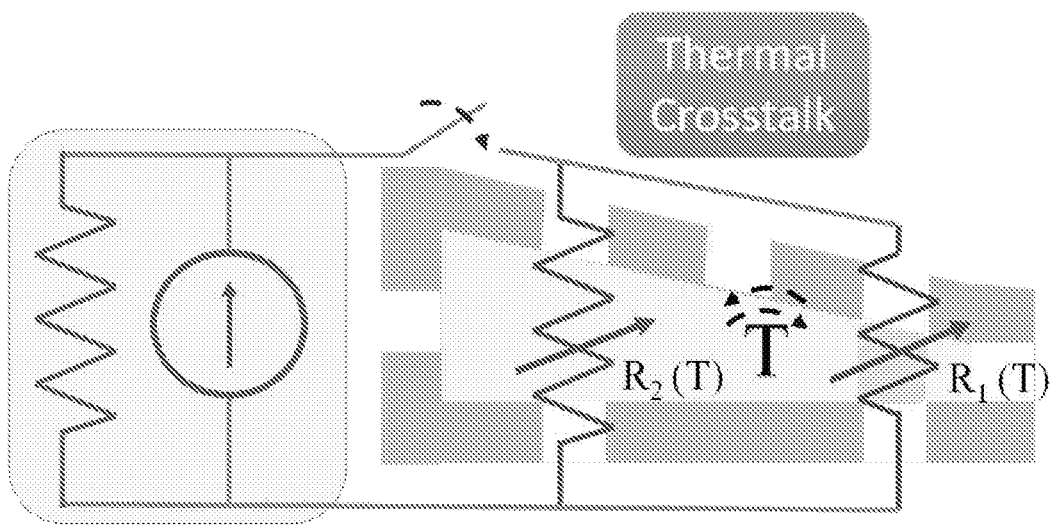
FIG. 34A illustrates another schematic of an example reconfigurable device.
Figure 34B:
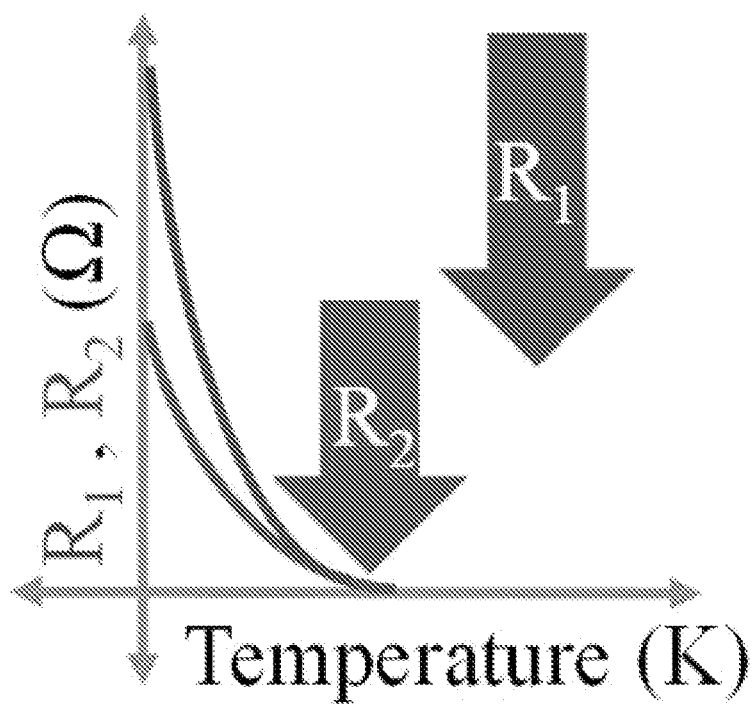
FIG. 34B is a graph illustrating the relationship of resistance and temperature of the device of FIG. 34A.
Figure 35A:
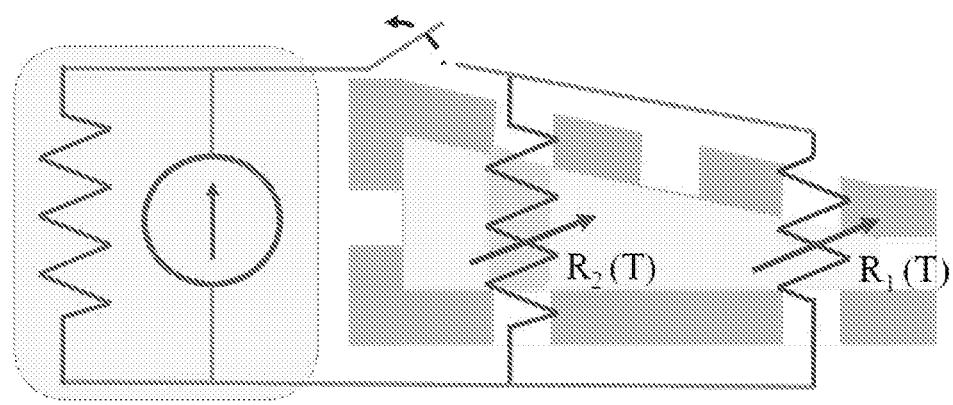
FIG. 35A illustrates another schematic of an example reconfigurable device.
Figure 35B:
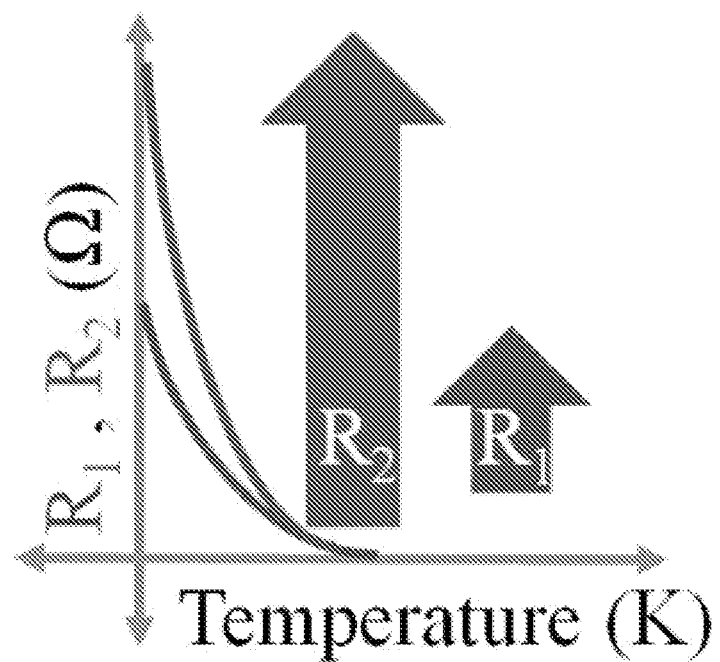
FIG. 35B is a graph illustrating the relationship of resistance and temperature of the device of FIG. 35A.

FIG. 32A illustrates another schematic of an example reconfigurable device. FIG. 32B is a graph illustrating the relationship of resistance and temperature of the device of FIG. 32A. When the switch is closed for the second time, R1 can have much higher resistance compared with R2, and the current will mainly flow in R2 and experience the positive feedback phenomenon discussed earlier. FIG. 33A illustrates another schematic of an example reconfigurable device. FIG. 33B is a graph illustrating the relationship of resistance and temperature of the device of FIG. 33A. As R2 heats up due the joule heating, R1 can experience heat. Depending on the amount of heat R1 experiences, R1 will start phase transitioning from the highly resistive amorphous to the conductive crystalline phase of the initial state, in growth from melt process. The resistance of R1 will start decreasing. However, even if R1 reached the crystalline state more current may be flowing in R2 as R2 is in the most conductive, liquid phase. FIG. 34A illustrates another schematic of an example reconfigurable device. FIG. 34B is a graph illustrating the relationship of resistance and temperature of the device of FIG. 34A. When the switch is open, R2 can rapid melt-quench and transition in to the highly resistive amorphous phase. R1 can transition back to the crystalline phase. FIG. 35A illustrates another schematic of an example reconfigurable device. FIG. 35B is a graph illustrating the relationship of resistance and temperature of the device of FIG. 35A.

Although the principles here are discussed with the context of thermal crosstalk and thermal runaway, these concepts can be extended to devices with materials other than phase change materials that exhibit a different form of resistance change due to a 'runway' and other forms of crosstalk.

Figure 36:
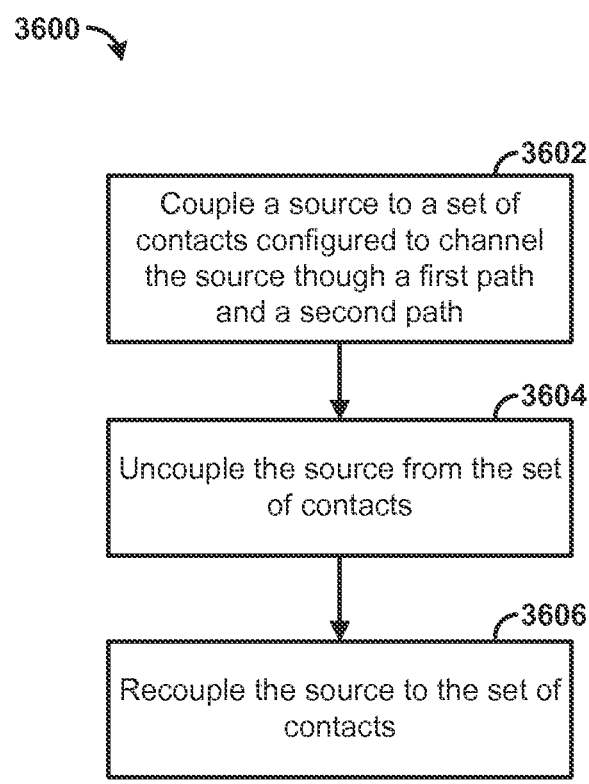
FIG. 36 is a flowchart illustrating an example method for operating a reconfigurable device.

FIG. 36 is a flowchart illustrating an example method for operating a reconfigurable device. At step 3602, a source can be coupled to a set of contacts configured to channel the source across a medium though a first path and a second path. Coupling the source can cause the first path to become more conductive than the second path. In an aspect, coupling the source can cause the first path to substantially short-circuit the second path.

The first path can be located close enough to the second path such that channeling of the source through the second path after the recoupling modifies the conductivity of the first path. Channeling of the source through the second path during the second coupling can recrystallize an amorphous region within the first path.

The medium can comprise a first edge and a second edge. A first distance between the first edge and the second edge where the first path is located can be shorter than a second distance between the first edge and the second edge where the second path is located. For example, the first path can be shorter than the second path.

At step 3604, the source can be uncoupled from the set of contacts. Uncoupling the first set of contacts can cause the first path to become less conductive than the second path. Uncoupling the source from the set of contacts can modify the first path to become more resistive than the second path. Modifying the first path can comprise forming an amorphous region in the medium within the first path.

At step 3606, the source can be recoupled to the set of contacts. Recoupling the first set of contacts can cause the second path to become more conductive than the second path. The recoupling can occur next in time (e.g., before any other coupling and/or uncoupling events) after uncoupling the first coupling.

Figure 37:
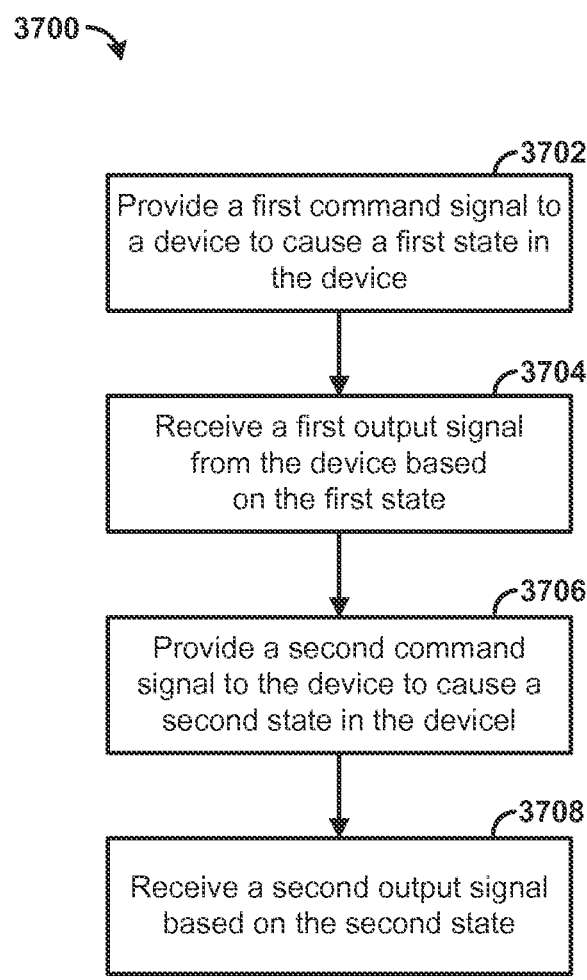
FIG. 37 is a flowchart illustrating an example method for operating a reconfigurable device.

FIG. 37 is a flowchart illustrating an example method for operating a reconfigurable device. At step 3702, a first command signal can be provided to a device. The first command signal can cause a first state in the device. For example, the device can comprise a reconfigurable device as described herein. The device can comprises a set of contacts configured to channel command signals through one or more of a first path and a second path. At least a portion of the first command signal can be channeled through the first path thereby causing the second path to become more conductive (e.g., via thermal cross talk). For example, the amorphous region in the second path can be crystallized by the portion of the first command signal channeled through the first path.

The device can comprise a medium. For example, the medium can comprise a reconfigurable layer as described herein. The medium can comprises a first edge and a second edge. A first distance between the first edge and the second edge where the first path is located is shorter than a second distance between the first edge and the second edge where the second path is located.

At step 3704, a first output signal can be received from the device based on the first state of the device. For example, a first input signal can be provided to the device. The device can channel, direct, supply, and/or the like the first input signal to an output contact based on the first state. The first command signal can be received, channeled, supplied, and/or the like primarily through the first path. For example, the first path can substantially short-circuit the second path (e.g., while the first input signal is being provided).

At step 3706, a second command signal can be provided to the device to cause a second state in the device. The second command signal can be received after receiving the first output signal. The second command signal can cause a second state in the device. At least a portion of the second command signal can be channeled through the second path thereby causing the first path to become more conductive (e.g., via thermal cross talk). Providing the second command signal can modify the second path to become more resistive than the first path. Modifying the second path can comprise forming an amorphous region in the medium within the second path. Providing the second command signal to the device can recrystallize an amorphous region within the first path.

At step 3708, a second output signal can be received based on the second state. For example, a second input signal can be provided to the device. The device can channel, direct, supply, and/or the like the second input signal to an output contact based on the second state. The second command signal can be received, channeled, supplied, and/or the like primarily through the second path. For example, the second path can substantially short-circuit the first path (e.g., while the second command signal is being provided). The device can be configured to switch between the first state and the second state each time an input signal is provided to and/or received by the device.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. An apparatus comprising:
a medium comprising a tube-shaped reconfigurable layer;
a set of contacts connected with the medium, wherein the set of contacts is configured to cause at least a first path in the tube-shaped reconfigurable layer of the medium and a second path in the tube-shaped reconfigurable layer of the medium; and
a control element electrically coupled with the set of contacts and configured to selectively couple a source to the set of contacts, wherein a first coupling of the source to the set of contacts causes the first path to become more conductive than the second path, and wherein a second coupling of the source with the set of contacts causes the first path to become more conductive than the second path.

2. The apparatus of claim 1, wherein uncoupling the first coupling of the source with the set of contacts modifies the first path to become more resistive than the second path.

3. The apparatus of claim 2, wherein modifying the first path comprises forming an amorphous region in the medium within the first path.

4. The apparatus of claim 1, wherein the first path is disposed with respect to the second path such that channeling of the source through the second path during the second coupling modifies a conductivity of the first path.

5. The apparatus of claim 4, wherein channeling of the source through the second path during the second coupling recrystallizes an amorphous region within the first path.

6. The apparatus of claim 1, wherein the second coupling occurs next in time after uncoupling the first coupling.

7. The apparatus of claim 1, wherein the medium comprises a first edge and a second edge, and wherein a first distance between the first edge and the second edge where the first path is located is shorter than a second distance between the first edge and the second edge where the second path is located.

8. The apparatus of claim 1, wherein the set of contacts comprises a plurality of input terminals and a plurality of output terminals, and the control element is further configured to cause a plurality of paths between the input terminals and the output terminals such that the plurality of paths do not cross in the tube-shaped reconfigurable layer and would cross in a planar reconfigurable layer.

9. The apparatus of claim 8, wherein there is a non-uniform spacing between the plurality of input terminals.

10. The apparatus of claim 8, wherein there is a non-uniform spacing between the plurality of output terminals.

11. The apparatus of claim 8, wherein there is a non-uniform spacing between different pairs of the plurality of input terminals and the plurality of output terminals.

12. A method comprising:
coupling a source to a set of contacts configured to channel the source across a medium through a first path of a tube-shaped reconfigurable layer of the medium and a second path of the tube-shaped reconfigurable layer, wherein coupling the source causes the first path to become more conductive than the second path;
uncoupling the source from the set of contacts, wherein uncoupling the source from the set of contacts causes the first path to become less conductive than the second path; and
recoupling the source to the set of contacts, wherein recoupling the source to the set of contacts causes the first path to become more conductive than the second path.

13. The method of claim 12, wherein coupling the source to the set of contacts causes the first path to substantially short-circuit the second path.

14. The method of claim 12, wherein uncoupling the source from the set of contacts modifies the first path to become more resistive than the second path.

15. The method of claim 12, wherein the first path is disposed with respect to the second path such that channeling of the source through the second path after the recoupling modifies a conductivity of the first path.

16. The method of claim 12, wherein the recoupling occurs next in time after uncoupling the first coupling.

17. The method of claim 12, wherein the medium comprises a first edge and a second edge, and wherein a first distance between the first edge and the second edge where the first path is located is shorter than a second distance between the first edge and the second edge where the second path is located.

* * * * *